US008325479B2

(12) United States Patent  
Siracki et al.

(10) Patent No.: US 8,325,479 B2
(45) Date of Patent: Dec. 4, 2012

(54) MOTOR DRIVE COOLING DUCT SYSTEM AND METHOD

(75) Inventors: Glenn T. Siracki, Burton, OH (US); Patrick J. Riley, Galena, OH (US)

(73) Assignee: Rockwell Automation Technologies, Inc., Mayfield Heights, OH (US)

( * ) Notice: Subject to any disclaimer, the term of this patent is extended or adjusted under 35 U.S.C. 154(b) by 95 days.

(21) Appl. No.: 12/837,888

(22) Filed: Jul. 16, 2010

(65) Prior Publication Data

US 2012/0014154 A1 Jan. 19, 2012

(51) Int. Cl.
*H05K 7/20* (2006.01)

(52) U.S. Cl. ............... 361/679.5; 361/690; 361/695; 361/679.48; 361/679.49; 361/692; 361/678

(58) Field of Classification Search .......... 361/690, 361/695, 679.48, 679.49, 679.5, 692, 678; 363/141

See application file for complete search history.

(56) References Cited

U.S. PATENT DOCUMENTS

| | | | | |
|---|---|---|---|---|
| 4,699,208 A * | 10/1987 | Wolf et al. | | 165/47 |
| 4,728,160 A * | 3/1988 | Mondor et al. | | 312/236 |
| 5,398,159 A * | 3/1995 | Andersson et al. | | 361/695 |
| 5,414,591 A * | 5/1995 | Kimura et al. | | 361/695 |
| 5,485,350 A * | 1/1996 | Hecht et al. | | 361/692 |
| 5,547,272 A * | 8/1996 | Paterson et al. | | 312/223.2 |
| 5,684,671 A * | 11/1997 | Hobbs et al. | | 361/679.57 |
| 6,039,414 A * | 3/2000 | Melane et al. | | 312/205 |
| 6,104,608 A * | 8/2000 | Casinelli et al. | | 361/692 |
| 6,164,369 A * | 12/2000 | Stoller | | 165/104.33 |
| 6,493,227 B2 * | 12/2002 | Nielsen et al. | | 361/703 |
| 6,504,714 B1 * | 1/2003 | Richter | | 361/695 |
| 6,628,520 B2 * | 9/2003 | Patel et al. | | 361/696 |
| 6,742,068 B2 * | 5/2004 | Gallagher et al. | | 710/302 |
| 6,819,563 B1 * | 11/2004 | Chu et al. | | 361/696 |
| 6,867,970 B2 * | 3/2005 | Muller et al. | | 361/695 |
| 6,875,101 B1 * | 4/2005 | Chien | | 454/184 |
| 6,876,549 B2 * | 4/2005 | Beitelmal et al. | | 361/692 |
| 6,889,752 B2 * | 5/2005 | Stoller | | 165/47 |
| 6,931,756 B2 | 8/2005 | Morgan et al. | | |
| 6,961,242 B2 * | 11/2005 | Espinoza-Ibarra et al. | ... | 361/695 |
| 7,016,191 B2 * | 3/2006 | Miyamoto et al. | | 361/679.33 |
| 7,046,513 B2 * | 5/2006 | Nishiyama et al. | | 361/695 |
| 7,079,379 B2 | 7/2006 | Yamaguchi et al. | | |
| 7,218,516 B2 * | 5/2007 | Yu et al. | | 361/695 |
| 7,226,353 B2 * | 6/2007 | Bettridge et al. | | 454/184 |
| 7,630,198 B2 * | 12/2009 | Doll | | 361/679.49 |
| 7,701,712 B2 * | 4/2010 | Kramer | | 361/695 |
| 7,813,121 B2 * | 10/2010 | Bisson et al. | | 361/679.51 |
| 7,813,129 B2 * | 10/2010 | Van Der Werff | | 361/695 |
| 7,826,216 B2 * | 11/2010 | Moss | | 361/679.49 |
| 7,862,410 B2 * | 1/2011 | McMahan et al. | | 454/184 |
| 7,898,810 B2 | 3/2011 | Mason et al. | | |

(Continued)

*Primary Examiner* — Anatoly Vortman
(74) *Attorney, Agent, or Firm* — Fletcher Yoder P.C.; Alexander R. Kuszewski; John M. Miller

(57) ABSTRACT

The present invention relates generally to tuning the flow of cooling air across converter and inverter heat sinks in a motor drive system. More specifically, present techniques relate to motor drive duct systems having parallel cooling air duct channels dedicated to providing cooling air for a converter heat sink and an inverter heat sink, respectively. In particular, a first duct channel through an inverter duct and a converter duct is dedicated to providing cooling air to the converter heat sink without cooling the inverter heat sink, whereas a second duct channel through the inverter duct and the converter duct is dedicated to providing cooling air to the inverter heat sink without cooling the converter heat sink.

20 Claims, 18 Drawing Sheets

U.S. PATENT DOCUMENTS

| | | |
|---|---|---|
| 7,903,403 B2 * | 3/2011 | Doll et al. ............... 361/679.5 |
| 8,081,465 B2 | 12/2011 | Nishiura |
| 2003/0053293 A1 * | 3/2003 | Beitelmal et al. ............ 361/687 |
| 2004/0223301 A1 * | 11/2004 | Muller et al. ............... 361/699 |
| 2005/0207134 A1 | 9/2005 | Belady et al. |
| 2006/0054380 A1 * | 3/2006 | Doll ............................ 181/225 |
| 2008/0310109 A1 | 12/2008 | Park et al. |
| 2009/0268405 A1 * | 10/2009 | Kaveh .......................... 361/697 |
| 2010/0091434 A1 | 4/2010 | Pereira et al. |
| 2010/0118488 A1 | 5/2010 | Hoffman et al. |
| 2010/0118493 A1 * | 5/2010 | Huang et al. ................. 361/700 |
| 2011/0110039 A1 | 5/2011 | Feltner et al. |
| 2011/0255237 A1 | 10/2011 | Doll |

* cited by examiner

MOTOR DRIVE COOLING DUCT SYSTEM AND METHOD

BACKGROUND

The present invention relates generally to the field of power electronic devices such as those used in power conversion or applying power to motors and similar loads. More particularly, the invention relates to a motor drive cooling duct system having optimized cooling air flow paths.

In the field of power electronic devices, a wide range of circuitry is known and currently available for converting, producing, and applying power to loads. Depending upon the application, such circuitry may convert incoming power from one form to another as needed by the load. In a typical arrangement, for example, constant (or varying) frequency alternating current power (such as from a utility grid or generator) is converted to controlled frequency alternating current power to drive motors, and other loads. In this type of application, the frequency of the output power can be regulated to control the speed of the motor or other device. Many other applications exist, however, for power electronic circuits which can convert alternating current power to direct current power (or vice versa) or that otherwise manipulate, filter, or modify electric signals for powering a load. Circuits of this type generally include rectifiers (converters), inverters, and similar switched circuitry. For example, a motor drive will typically include a rectifier that converts AC power to DC. Power conditioning circuits, such as capacitors and/or inductors, are often employed to remove unwanted voltage ripple on the internal DC bus. Inverter circuitry can then convert the DC signal into an AC signal of a particular voltage and frequency desired for driving a motor at a particular speed or torque. The inverter circuitry typically includes several high power semiconductor devices, such as insulated-gate bipolar transistors (IGBTs), silicon controlled rectifiers (SCRs) and diodes controlled by drive circuitry.

The power semiconductors detailed above will typically generate substantial amounts of heat, which must be dissipated to avoid damaging heat sensitive electronics. Typically, therefore, some form of cooling mechanism may be employed to enhance heat extraction and dissipation. Often, the circuitry is packaged together as a unit with a built-in cooling channel that provides cool air to several components. It is now recognized that, because the air within the channel is heated as it travels through the channel, components near the exhaust end of the air channel will usually experience a diminished cooling effect. Therefore, as packaged control units become more compact, the need for efficient heat dissipation becomes more critical. Additionally, as the workload or motor speed changes, the temperature of the semiconductors generally increases, causing higher failure rates and reduced reliability. The output of the unit is often, therefore, limited by the maximum temperature that the unit can handle without substantially increasing the risk of failure. A more effective cooling mechanism would, therefore, allow the motor drive to operate at higher motor power levels. Therefore, it may be advantageous to provide a motor drive with an improved cooling mechanism. In particular, it may be advantageous to provide a cooling mechanism which provides a reduced air flow resistance and increased air flow while maintaining a high level of thermal performance.

BRIEF DESCRIPTION

The present invention relates generally to tuning the flow of cooling air across converter and inverter heat sinks in a motor drive system. More specifically, present techniques relate to motor drive duct systems having parallel cooling air duct channels dedicated to providing cooling air for a converter heat sink and an inverter heat sink, respectively. In particular, a first duct channel through an inverter duct and a converter duct is dedicated to providing cooling air to the converter heat sink without cooling the inverter heat sink, whereas a second duct channel through the inverter duct and the converter duct is dedicated to providing cooling air to the inverter heat sink without cooling the converter heat sink. A guide vane adjacent to the inverter duct may control the flow of cooling air from a blower between the first and second duct channels. In addition, the inverter duct and the converter duct may both include baffled walls that direct cooling air into contact with the inverter heat sink and the converter heat sink, respectively, such that temperature gradients across the heat sinks are minimized.

DRAWINGS

These and other features, aspects, and advantages of the present invention will become better understood when the following detailed description is read with reference to the accompanying drawings in which like characters represent like parts throughout the drawings, wherein.

DETAILED DESCRIPTION

Figure 1:
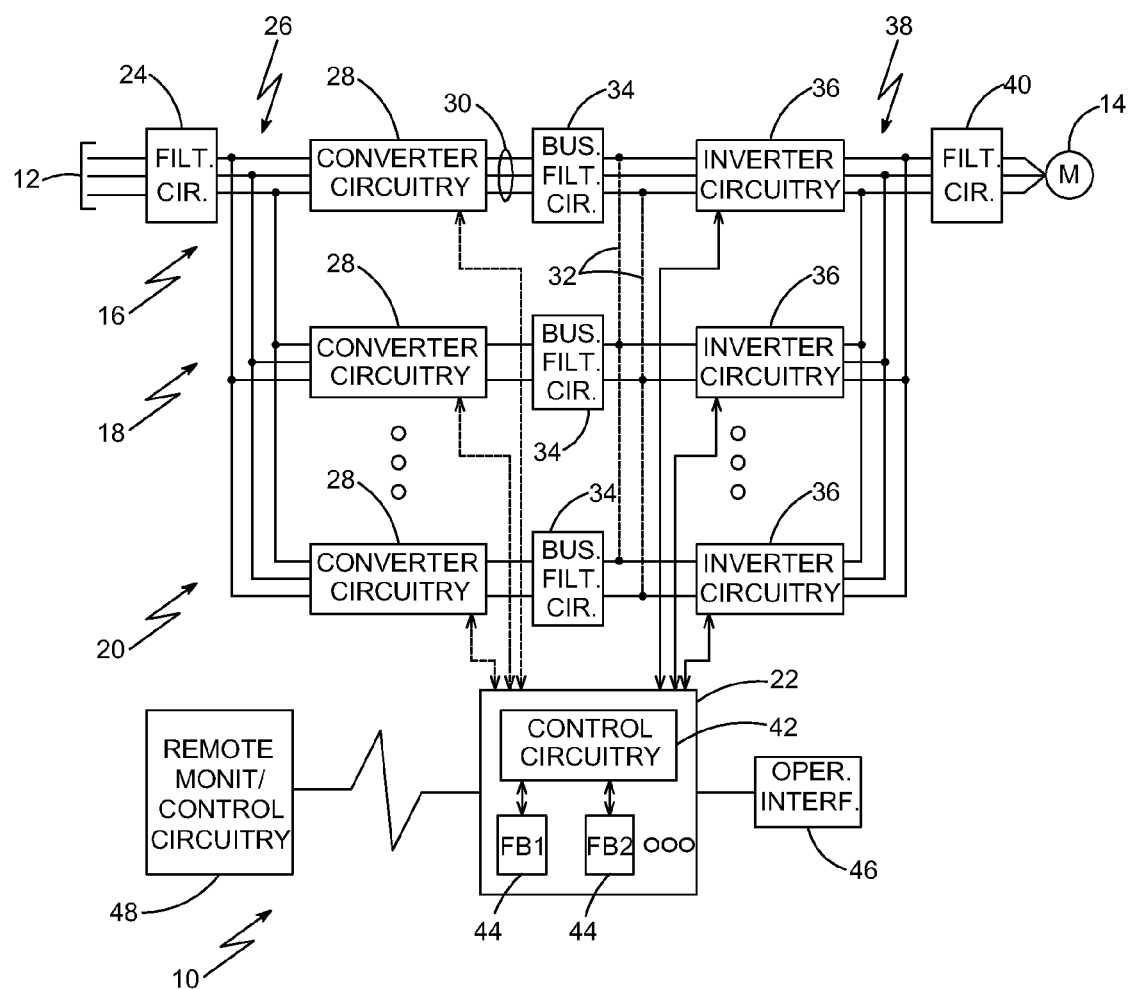
FIG. 1 is a diagrammatical representation of an exemplary embodiment of a motor drive system.

Turning now to the drawings, FIG. 1 represents a drive system 10 in accordance with aspects of the present disclosure. The drive system 10 is configured to be coupled to a source of AC power, such as the power grid, as indicated by reference numeral 12, and to deliver conditioned power to a motor 14 or any other suitable load. The system 10 comprises a plurality of individual drives coupled to one another in parallel to provide power to the load. In the example illustrated in FIG. 1, for example, a first drive 16 is illustrated as coupled to a second drive 18 and a further drive 20 which may be the third, fourth, fifth, or any suitable terminally numbered drive. A presently contemplated embodiment may accommodate up to five parallel drives, although fewer or more may be configured in the same way. It should be noted that certain aspects of the techniques described herein may be used with a single drive. However, other aspects are particularly well-suited for multiple parallel drives.

A controller 22 is coupled to the circuitry of each drive and is configured to control operation of the circuitry as described more fully below. In a presently contemplated embodiment, the controller 22 may be housed in one of the drives or in a separate enclosure. Appropriate cabling (e.g., fiber optic cabling) is provided to communicate control and feedback signals between the controller 22 and the circuitry of the individual drives. The controller 22 will coordinate operation of the drives to ensure that the provision of power is shared and that operation of the drives is synchronized sufficiently to provide the desired power output to the motor 14. In the embodiment illustrated in FIG. 1, power filtration circuitry 24 may be provided upstream of the motor drives. Such circuitry may be provided upstream of a line-side bus 26 or similar circuitry may be provided downstream of the bus in each of the drives. Such circuitry may include inductors, capacitors, circuit breakers, fuses, and so forth, that are generally conventional in design and application.

The power bus 26 distributes three phases of AC power between the individual drives. Downstream of this bus, each drive includes converter circuitry 28 that converts the three phases of AC power to DC power that is applied to a DC bus 30. The converter circuitry 28 may be passive or active. That is, in a presently contemplated embodiment, non-switched circuitry alone is used to define a full wave rectifier that converts the incoming AC power to DC power that is applied to the bus. In other embodiments, the converter circuitry 28 may be active, including controlled power electronic switches that are switched between conducting and non-conducting states to control the characteristics of the DC power applied to the bus.

Continuing with the components of each drive, bus filtration circuitry 34 may be provided that conditions the DC power conveyed along the DC busses 30. Such filtration circuitry may include, for example, capacitors, inductors (e.g., chokes), braking resistors, and so forth. In some embodiments, common devices may be provided on the DC busses, which may be coupled to one another by links illustrated by reference numeral 32.

Each drive further includes inverter circuitry 36. As will be appreciated by those skilled in the art, such circuitry will typically include sets of power electronic switches, such as insulated gate bipolar transistors (IGBTs) and diodes arranged to allow for converting the DC power from the bus to controlled frequency AC output waveforms. The inverters thus create three phases of controlled frequency output, with each phase being shorted or combined along an output bus 38. The combined power may be applied to output filtration circuitry 40, which may include magnetic components that couple the output power between the phases. Such circuitry may also be provided along the load-side bus 38.

The controller 22 will typically include control circuitry 42 that is configured to implement various control regimes by properly signaling the inverter circuitry 36 (and, where appropriate, the converter circuitry 28) to control the power electronic switches within these circuits. The control circuitry 42 may, for example, include any suitable processor, such as a microprocessor, field programmable gate array (FPGA), memory circuitry, supporting power supplies, and so forth. In motor drive applications, the control circuitry 42 may be configured to implement various desired control regimes, such as for speed regulation, torque control, vector control, start-up regimes, and so forth. In the embodiment illustrated in FIG. 1, various functional circuit boards 44 are linked to the control circuitry 42 and may be provided for specific functions. For example, a wide range of options may be implemented by the use of such circuitry, including the control regimes mentioned above, as well as various communications options, safety options, and so forth.

The controller 22 will typically allow for connection to an operator interface, which may be local at the controller and/or remote from it. In a presently contemplated embodiment, for example, an operator interface 46 may be physically positioned on the controller 22 but removable for hand-held interfacing. The interface circuitry (e.g., portable computers) may also be coupled permanently or occasionally to the controller 22, such as via Internet cabling, or other network protocols, including standard industrial control protocols. Finally, the controller 22 may be coupled to various remote monitoring and control circuitry as indicated by reference numeral 48. Such circuitry may include monitoring stations, control stations, control rooms, remote programming stations, and so forth. It should be noted that such circuitry may also include other drives, such that the operation of the system 10 may be coordinated, where desired, with that of other equipment. Such coordination is particularly useful in automation settings where a large number of operations are performed in a coordinated manner. Thus, the control circuitry 42 may form its control in coordination with logic implemented by automation controllers, separate computers, and so forth.

Figure 2:
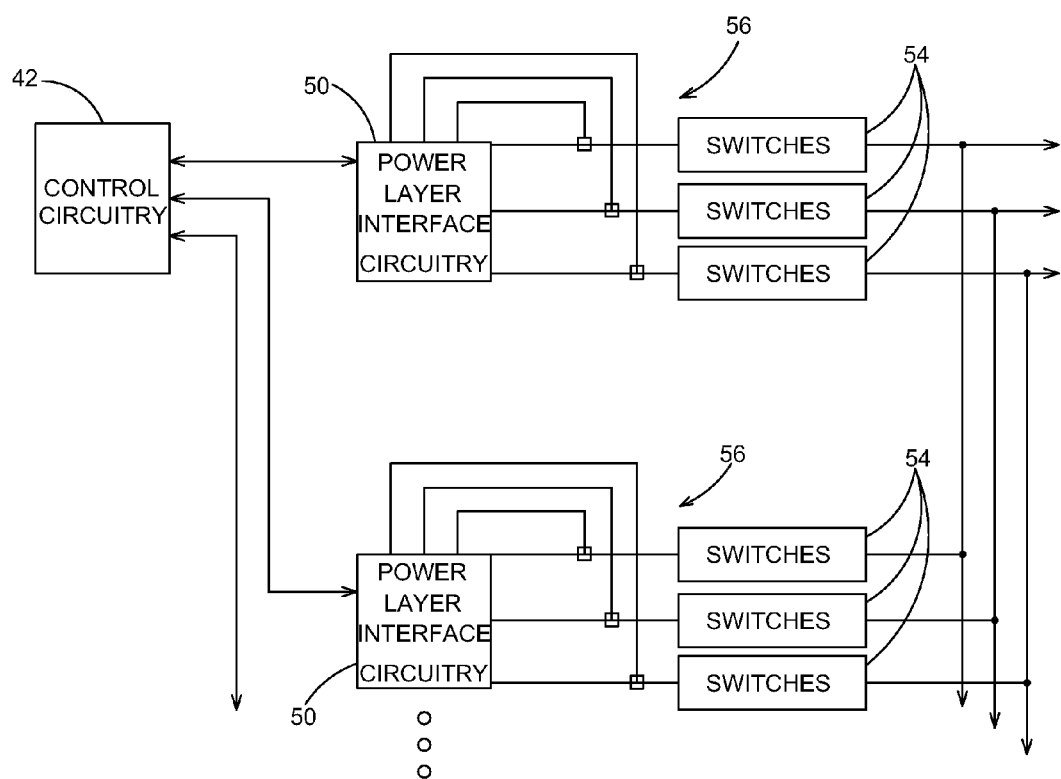
FIG. 2 is further diagrammatical representation of a portion of the motor drive system of FIG. 1 illustrating power layer interface circuitry used in the multiple parallel motor drives.

FIG. 2 illustrates certain of the components that may be included within the individual drives described above. For example, the control circuitry 42 is illustrated as being coupled to power layer interface circuitry 50. Such circuitry will be provided in each drive and will operate independently within the drive, but in a coordinated manner under the control of the control circuitry. The power layer interface circuitry may include a range of circuits, such as a dedicated processor, memory, and so forth. In a presently contemplated embodiment, the power layer interface circuitry 50 includes an FPGA that implements programming for carrying out control of the power electronic switches within the individual drive. The power layer interface circuitry thus communicates with the power layer as indicated by reference numeral 52, which is itself comprised of sets of power electronic devices, such as IGBTs and diodes. These switches are illustrated generally by reference numeral 54. In a typical arrangement, the switches may be provided on a single support or on multiple supports. For example, in a presently contemplated embodiment separate supports are provided for each phase of power, with multiple IGBTs and diodes being provided on each support. These devices themselves may be constructed in any suitable manner, such as direct bond copper stacks, lead frame packages, and so forth. In general, one or several types of feedback will be provided in the circuitry as indicated by reference numeral 56. Such feedback may include, for example, output voltages, output currents, temperatures, and so forth. Other feedback signals may be provided throughout the system, such as to allow the control circuitry to monitor the electrical parameters of the incoming power, the outgoing power, the DC bus power, and so forth.

Figure 3:
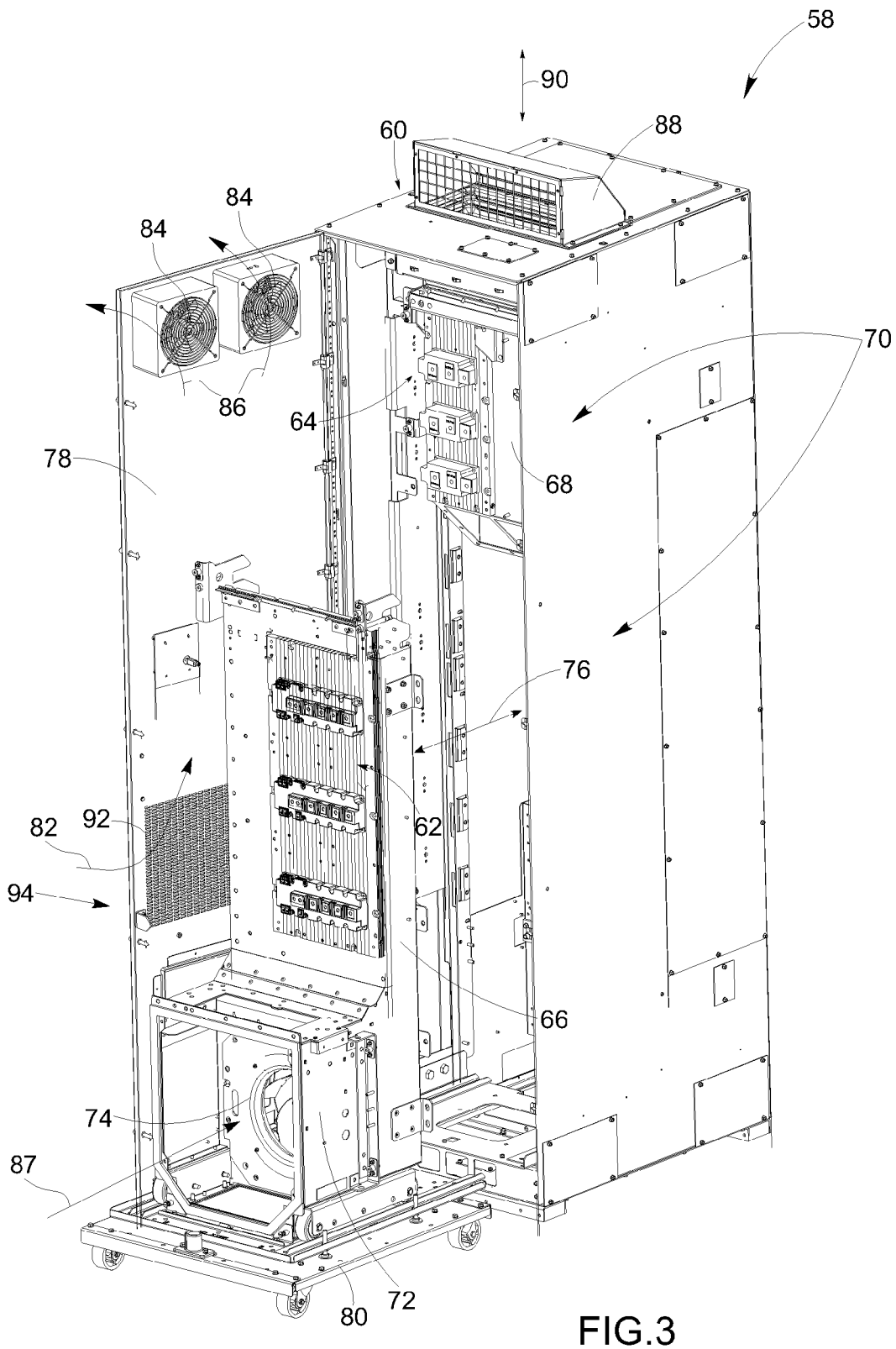
FIG. 3 is a perspective view of an exemplary embodiment of a cabinet, within which components of a motor drive may be housed.

FIG. 3 is a perspective view of an exemplary embodiment of a cabinet 58, within which components of a motor drive 60 are housed. As illustrated, the cabinet 58 includes an inverter 62 (e.g., including the inverter circuitry 36 of FIG. 1) and a converter 64 (e.g., including the converter circuitry 28 of FIG. 1), among other components. The inverter 62 is at least partially attached to an inverter duct 66, and the converter 64 is at least partially attached to a converter duct 68. More specifically, the inverter 62 is sealingly attached to the inverter duct 66 such that the inverter duct 66 supports the inverter 62 when the inverter duct 66 is removed from the cabinet 58, and the converter 64 is sealingly attached to the converter duct 68 such that the converter duct 68 supports the converter 64 when the converter duct 68 is removed from the cabinet 58. In addition, heat sink components of the inverter 62 and converter 64 may be disposed within the inverter duct 66 and the converter duct 68, respectively. In the illustrated embodiment, the inverter 62 and related components (e.g., the inverter duct 66) have been rolled out of the cabinet 58 and are separated from the converter 64 and related components (e.g., the converter duct 68).

When coupled together, the inverter duct 66 and the converter duct 68 form a duct system 70 or a portion of the duct system 70 for the motor drive 60. In addition, the inverter duct 66 is attached to an inlet air duct 72, within which a blower 74 is housed. The inlet air duct 72 may also be considered a component of the duct system 70. Indeed, in certain embodiments, the inverter duct 66 and the inlet air duct 72 may be integrated into a single unit. However, in other embodiments, the inverter duct 66 and the inlet air duct 72 may be separate. As described in greater detail below, the inverter duct 66, the converter duct 68, and an exhaust duct (not shown) may define a pair of parallel air flow channels of the duct system 70, through which cooling air blown by the blower 74 may flow. As also described in greater detail below, the inverter duct 66, the converter duct 68, and the exhaust duct include angled interfaces that mate during assembly of the inverter duct 66, the converter duct 68, and the exhaust duct to form the duct system 70. The cooling air flowing through the parallel air flow channel paths is used to dissipate heat from the heat sinks associated with the inverter 62 and the converter 64.

As illustrated by arrow 76 in FIG. 3, the inlet air duct 72 and the inverter duct 66 may be rolled into and out of the cabinet 58 when a cabinet door 78 is opened. In particular, in certain embodiments, the inlet air duct 72 and the inverter duct 66 are integral with or positioned on a transport device. In the illustrated embodiment, the inlet air duct 72 and the inverter duct 66 are placed on an auxiliary cart or platform 80 facilitate movement of the inlet air duct 72 and inverter duct 66 relative to the converter duct 68 and other aspects of the cabinet 58 such that field wiring of the motor drive 60 may be accessed.

The auxiliary cart or platform 80 illustrated in FIG. 3 is but one exemplary embodiment, and other types of auxiliary carts or platforms 80 may be used to facilitate movement of the inlet air duct 72 and inverter duct 66 relative to the converter duct 68 and other aspects of the cabinet 58.

When considered together, the inverter 62, the inverter duct 66, the inlet air duct 72 (i.e., the inlet/inverter duct assembly 94), and associated components are generally the heaviest portion of the motor drive 60. Accordingly, the ability of present embodiments to roll the inlet/inverter duct assembly 94 into and out of the cabinet 58 facilitates maintenance of the motor drive 60 relative to traditional systems. In addition, in certain embodiments, the converter 64 and associated converter duct 68 may be removed through the top of the cabinet 58 once an exhaust vent 88 is removed, as illustrated by arrow 90. Indeed, some embodiments may include an integral hook or eyelet on the converter duct 68 for this purpose. Locating the converter 64 and converter duct 68 in the top portion of the cabinet 58 further facilitates maintenance of the motor drive 60 because the converter 64 and associated converter duct 68 are generally not as heavy as the combined weight of the inlet/inverter duct assembly 94. In particular, the embodiments described herein increase the modularity of the motor drive 60 without including complicated joints and avoiding the need to disturb field wiring. For example, the inverter 62 and inverter duct 66 may be removed without the need to remove the rest of the motor drive 60 when the inverter 62 requires servicing. In particular, the inverter duct 66 may be capable of supporting the inverter 62 when the inverter duct 66 is removed from the cabinet 58 without removal of the inverter 62 from the inverter duct 66. Similarly, the converter duct 68 may be capable of supporting the converter 64 when the converter duct 68 is removed from the cabinet 58 without removal of the converter 64 from the converter duct 68. Moreover, the inverter duct 66 and the converter duct 68 may be capable of supporting the inverter 62 and the converter 64 when the inverter duct 66 and the converter duct 68 are removed from the cabinet 58 together without removal of the inverter 62 from the inverter duct 66 and without removal of the converter 64 from the converter duct 68.

When the system components are assembled, the cabinet door 78 is closed, and the motor drive 60 is in operation, air is drawn into the cabinet 58 through vents 92 in the cabinet door 78, as illustrated by arrow 82. The air drawn in through the vents 92 is then expelled through fans 84 in the cabinet door 78 to discard waste heat in the cabinet 58, as illustrated by arrows 86. In addition, air 87 is also drawn into the cabinet 58 and into the inlet air duct 72, where it is blown by the blower 74 through parallel ducts channels of the inverter duct 66. The air blown through the parallel duct channels of the inverter duct 66 is then directed through the mated parallel duct channels of the converter duct 68. Then, the air directed through the parallel duct channels of the converter duct 68 is directed through mated parallel duct channels of an exhaust duct and out of the top of the cabinet 58 through the exhaust vent 88. This air flow through the various duct segments passes over heat sinks associated with the inverter 62 and the converter 64 and provides cooling for these components.

Figure 4:
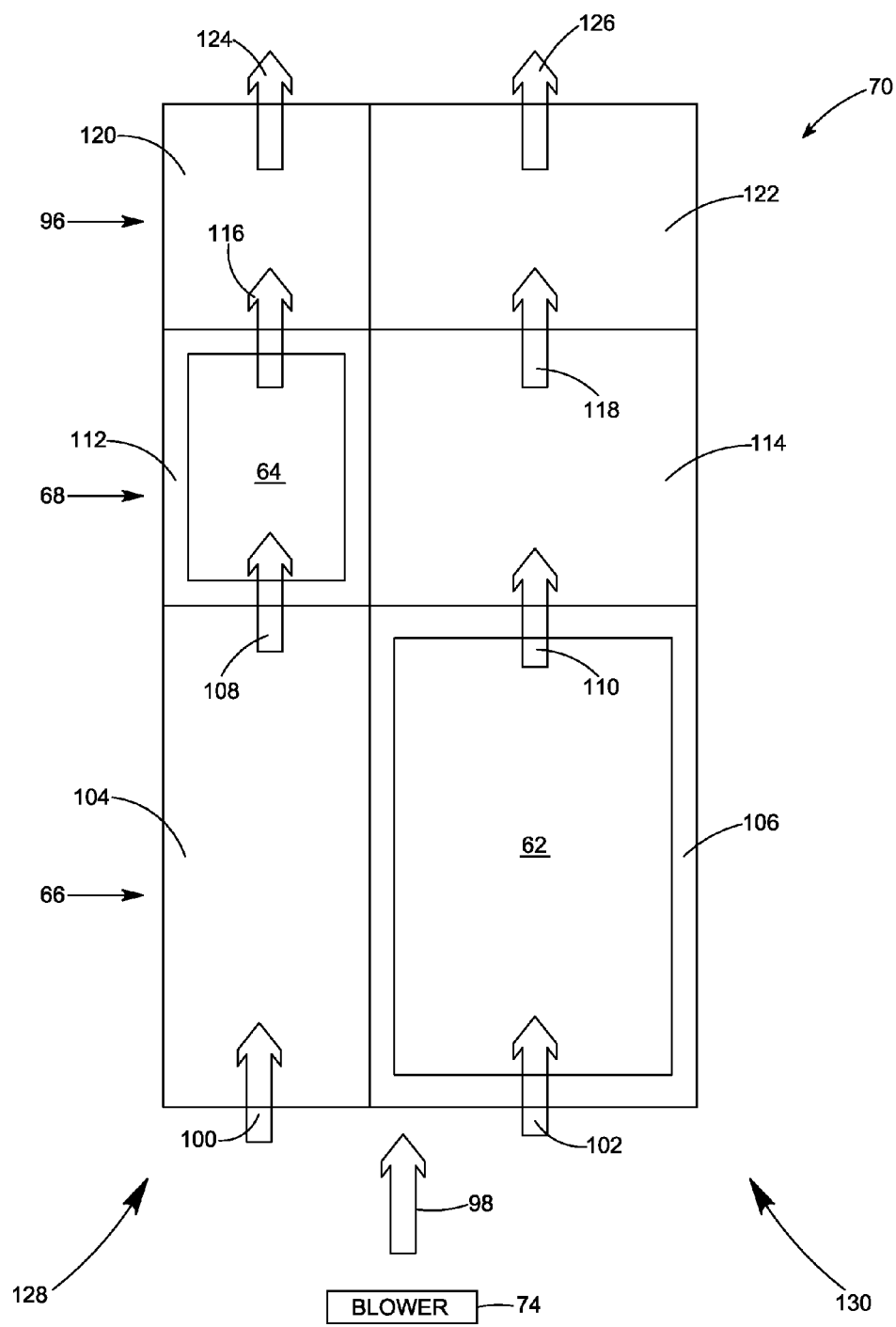
FIG. 4 is a schematic diagram of an exemplary embodiment of a motor drive duct system, which includes an inverter duct, a converter duct, and an exhaust duct.

For example, FIG. 4 is a schematic diagram illustrating cooling air flow paths through an exemplary embodiment of the duct system 70, which includes the inverter duct 66, the converter duct 68, and an exhaust duct 96. As illustrated, the inverter duct 66 is attached to at least a portion of the inverter 62, the converter duct 68 is attached to at least a portion of the converter 64, and the exhaust duct 96 is attached to no functional components of the motor drive 60. Inlet air flow 98 to the duct system 70 is generated by the blower 74 and is initially split into a first air flow 100 and a second air flow 102 by separate channels of the inverter duct 66. However, in other embodiments, the inlet air flow 98 may be split into separate flow paths prior to entering the inverter duct 66 (e.g., by a baffle or channels in the inlet air duct 72). The first and second air flows 100, 102 proceed through corresponding channels of segments of the duct system 70 and encounter different system components (e.g., heat sinks of the inverter 62 and the converter 64), which cause different temperature changes in the air. Indeed, air coming into and out of a particular channel of a duct segment will have different characteristics. Similarly, air exiting or entering a first channel of a duct segment will have characteristics that are different from air exiting or entering a second channel of the same duct segment. Thus, while the air of each air flow 100, 102 remains the same, different portions of the air flow will have different temperatures, pressures, and velocities, and will be indicated by arrows with different reference numbers based on location in the duct system 70 to facilitate discussion.

As illustrated in FIG. 4, the first air flow 100 is blown into a first inverter duct channel 104 of the inverter duct 66, and the second air flow 102 is blown into a second inverter duct channel 106 of the inverter duct 66. The second air flow 102 is used to dissipate heat generated by the inverter 62 through an inverter heat sink. Indeed, the second air flow 102 enters the second inverter duct channel 106, pulls heat away from the heat sink as it passes over the inverter 62, and exits the second inverter duct channel 106. This generally causes an increase in the temperature of the air flow 102 and a reduction in the speed of the air flow due to interaction with heat sink fins and so forth. In contrast, the first air flow 100 generally flows unimpeded through the first inverter duct channel 104. Indeed, the first inverter duct channel 104 is substantially vacant and, thus, does not substantially obstruct the first air flow 100. In general, the first inverter duct channel 104 and the second inverter duct channel 106 are adjacent to and parallel with each other and are partially defined by front and back walls of the inverter duct 66 and an interior partition wall, as described below. In other words, the first inverter duct channel 104 and the second inverter duct channel 106 may share common front and back walls and the interior partition wall. However, in certain embodiments, the front wall locations of the first and/or second inverter duct channels 104, 106 may be used to tune the air flow balance between the first and second inverter duct channels 104, 106.

Upon exiting the corresponding channels of the inverter duct 66, the first air flow 100 may be referred to as first air flow 108 and the second air flow 102 may be referred to as second air flow 110, as indicated by the corresponding arrows in FIG. 4. The first air flow 108 exiting the first inverter duct 104 is directed into a first converter duct channel 112 of the converter duct 68, and the second air flow 110 exiting the second inverter duct channel 106 is directed into a second converter duct channel 114 of the converter duct 68. Because the second air flow 110 exiting the second inverter duct channel 106 was used to carry away heat from the heat sink associated with the inverter 62, the temperature of the second air flow 110 entering the second converter duct channel 114 will generally be higher than the temperature of the first air flow 108 entering the first converter duct channel 112. The first air flow 108 in the first converter duct channel 112 is used to dissipate heat generated by the converter 64 through a converter heat sink. Indeed, the first air flow 108 enters the first converter duct channel 112, pulls heat away from the heat sink as it passes over the converter 64, and exits the first converter duct channel 112. This generally causes an increase in the temperature of the first air flow 108 and a reduction in the speed of the air flow due to interaction with heat sink fins and so forth. In contrast, the second air flow 110 generally flows unimpeded through the second converter duct channel 114. Indeed, the second converter duct channel 114 is substantially vacant and, thus, does not substantially obstruct the second air flow 110. In general, the first converter duct channel 112 and the second converter duct channel 114 are adjacent to and parallel with each other and are partially defined by front and back walls of the converter duct 68 and an interior partition wall, as described below. In other words, the first converter duct channel 112 and the second converter duct channel 114 share common front and back walls and the interior partition wall. However, in certain embodiments, the front wall locations of the first and/or second converter duct channels 112, 114 may be used to tune the air flow balance between the first and second converter duct channels 112, 114.

Upon exiting the corresponding channels of the converter duct 68, the first air flow 108 may be referred to as first air flow 116 and the second air flow 110 may be referred to as second air flow 118, as indicated by the corresponding arrows in FIG. 4. The first air flow 116 exiting the first converter duct channel 112 is directed into a first exhaust duct channel 120 of the exhaust duct 96, and the second air flow 118 exiting the second converter duct channel 114 is directed into a second exhaust duct channel 122 of the exhaust duct 96. Because the first air flow 116 exiting the first converter duct channel 112 was used to carry away heat from the heat sink associated with the converter 64, the temperature of the first air flow 116 exiting the first converter duct channel 112 will generally be higher than the temperature of the first air flow 108 entering the first converter duct channel 112. The first and second air flows 116, 118 entering the first and second exhaust duct channels 120, 122 generally flow unimpeded through the first and second exhaust duct channels 120, 122, respectively, and exit as first and second exhaust air flows 124, 126 through the exhaust vent 88 in the top of the cabinet 58 of FIG. 3. In other words, both the first and second exhaust duct channels 120, 122 are substantially vacant. In general, the first exhaust duct channel 120 and the second exhaust duct channel 122 are adjacent to and parallel with each other and are partially defined by front and back walls of the exhaust duct 96 and a common interior partition wall. In addition, in certain embodiments, the exhaust duct 96 may only include one common duct path, into which the first and second air flows 116, 118 may flow before exiting the exhaust duct 96.

The first inverter duct channel 104, first converter duct channel 112, and first exhaust duct channel 120 form a first duct channel path 128. Similarly, the second inverter duct channel 106, second converter duct channel 114, and second exhaust duct channel 122 form a second duct channel path 130. In general, the first air flow 100, 108, 116, 124 through the first duct channel path 128 is used to dissipate and carry away heat generated by the converter 64, whereas the second air flow 102, 110, 118, 126 through the second duct channel path 130 is used to dissipate and carry away heat generated by the inverter 62. The first and second duct channel paths 128, 130 form parallel air cooling paths through which the cooling air may be routed. In particular, the first duct channel path 128 is dedicated to providing cooling air for the heat sink associated with the converter 64, and the second duct channel path 130 is dedicated to providing cooling air for the heat sink associated with the inverter 62. As such, the parallel duct channel paths 128, 130 eliminate preheating of the cooling air to downstream heat sinks, as would occur if the duct channel paths 128, 130 were in series, because each duct channel path 128, 130 receives ambient air. That is, essentially ambient air is passed over the respective heat sinks in each duct channel path 128, 130 in accordance with the present embodiments because the duct channel paths 128, 130 are in parallel instead of in series.

In certain embodiments, the second duct channel path 130 may have a substantially greater cross-sectional volume than the first duct channel path 128, enabling higher cooling air flow rates across the heat sink associated with the inverter 62 than across the heat sink associated with the converter 64. In other words, the volumes of the parallel duct channel paths 128, 130 are dimensioned to pass cooling air at volumes or rates configured to optimize the cooling of the inverter 62 and the converter 64. This is due at least in part to the fact that the inverter 62 typically generates more heat than the converter 64. The parallel duct channel paths 128, 130 allow for balancing of air flow through each duct channel path 128, 130 inasmuch as the parallel duct channel paths 128, 130 may be resized based on predicted heat generation of the inverter 62 and the converter 64. The parallel duct channel paths 128, 130 also eliminate the need for individual blowers for each power section, thereby reducing the size of the duct system 70 and the cabinet 58 of FIG. 3. In certain embodiments, an inverter 62 may be used without a converter 64 for common bus or parallel drive applications. In these embodiments, the first duct channel path 128 may be blocked off at the interface between the inverter duct 66 and the converter duct 68, and an alternate duct section may be substituted for the converter duct 68.

As described above with respect to FIG. 3, the inverter duct 66 may be rolled into and out of the cabinet 58 such that it is separated from the converter duct 68, as illustrated by arrow 76 in FIG. 3. When the inverter duct 66 and the converter duct 68 are assembled together, mating angled surfaces of the inverter duct 66 and the converter duct 68 abut each other, connecting the first inverter duct channel 104 with the first converter duct channel 112, and connecting the second inverter duct channel 106 with the second converter duct channel 114.

Figure 5:
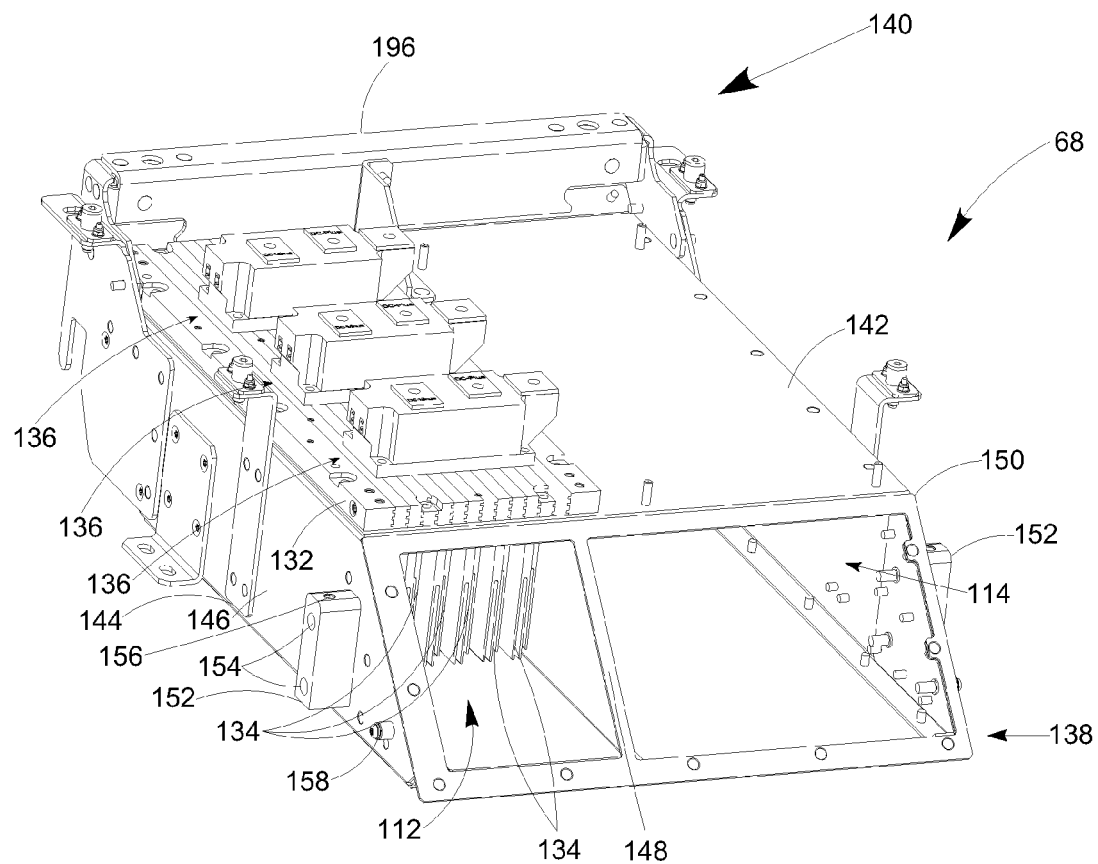
FIG. 5 is a perspective view of an exemplary embodiment of the converter duct when extracted from the cabinet of FIG. 3.

FIG. 5 is a perspective view of an exemplary embodiment of the converter duct 68 extracted from the cabinet 58 of FIG. 3. As illustrated, a converter heat sink 132 having a plurality of heat sink fins 134 extending into the first converter duct channel 112 is attached to the converter duct 68. In addition, components 136 of the converter 64 are attached to the converter heat sink 132 on a side of the converter heat sink 132 opposite the plurality of heat sink fins 134 such that the components 136 are external to the first converter duct channel 112. As described above, cooling air flowing through the first converter duct channel 112 dissipates and carries away heat generated by the components 136 of the converter 64. In particular, heat generated by the components 136 of the converter 64 flows through the converter heat sink 132 and associated heat sink fins 134 into the first converter duct channel 112. The heat is then transferred from the heat sink fins 134 to cooling air flowing from an upstream end 138 of the converter duct 68 and carried to a downstream end 140 of the converter duct 68 through the first converter duct channel 112.

As illustrated, the converter duct 68 includes an angled upstream end 138 that mates with a downstream end of the inverter duct 66 as described below. In particular, in certain embodiments, the upstream end 138 of the converter duct 68 extends out from a front wall 142 of the converter duct 68 to a back wall 144 of the converter duct 68 at an oblique angle (i.e., not a right angle). More specifically, the upstream end 138 of the converter duct 68 is at an obtuse angle (e.g., greater than 90° angle) with respect to the front wall 142 of the converter duct 68, and is at an acute angle (e.g., less than 90° angle) with respect to the back wall 144 of the converter duct 68. For example, in certain embodiments, the angle of the upstream end 138 with respect to the front wall 142 of the converter duct 68 is approximately 135° (see, e.g., angle θ illustrated in FIG. 8), whereas the angle of the upstream end 138 with respect to the back wall 144 of the converter duct 68 is approximately 45° (see, e.g., angle φ illustrated in FIG. 8). The 45° and 135° angles optimize the sealing of both the front wall 142 and the back wall 144 with the upstream end 138 of the converter duct 68.

The first converter duct channel 112 of the converter duct 68 is defined between the front and back walls 142, 144 of the converter duct 68, a left wall 146 of the converter duct 68, and an interior partition wall 148 extending from the front wall 142 to the back wall 144 within the converter duct 68. The second converter duct channel 114 of the converter duct 68 is defined between the front and back walls 142, 144 of the converter duct 68, a right wall 150 of the converter duct 68, and the interior partition wall 148 extending from the front wall 142 to the back wall 144 within the converter duct 68.

The converter duct 68 includes generally rectangular-shaped or obround keys 152 attached to both the left and right walls 146, 150 of the converter duct 68. In particular, in certain embodiments, the keys 152 are attached to the left and right walls 146, 150 of the converter duct 68 via two or more fasteners 154. As described in greater detail below, the keys 152 are configured to mate with brackets attached to the inverter duct 66 to align the converter duct 68 with the inverter duct 66 when the converter duct 68 and the inverter duct 66 are assembled together. In addition, the keys 152 include keyholes 156 extending at least partially through the keys 152 from front to back. As also described in greater detail below, the keyholes 156 are configured to mate with pins that help secure the converter duct 68 to the inverter duct 66 when the converter duct 68 and the inverter duct 66 are assembled together. The converter duct 68 also includes at least one additional alignment feature 158 extending from the left and right walls 146, 150 of the converter duct 68. The alignment features 158 are also configured to mate with the brackets attached to the inverter duct 66 to align the converter duct 68 with the inverter duct 66 when the converter duct 68 and the inverter duct 66 are assembled together. In addition, in certain embodiments, the alignment features 158 may act as additional keys.

Figure 6:
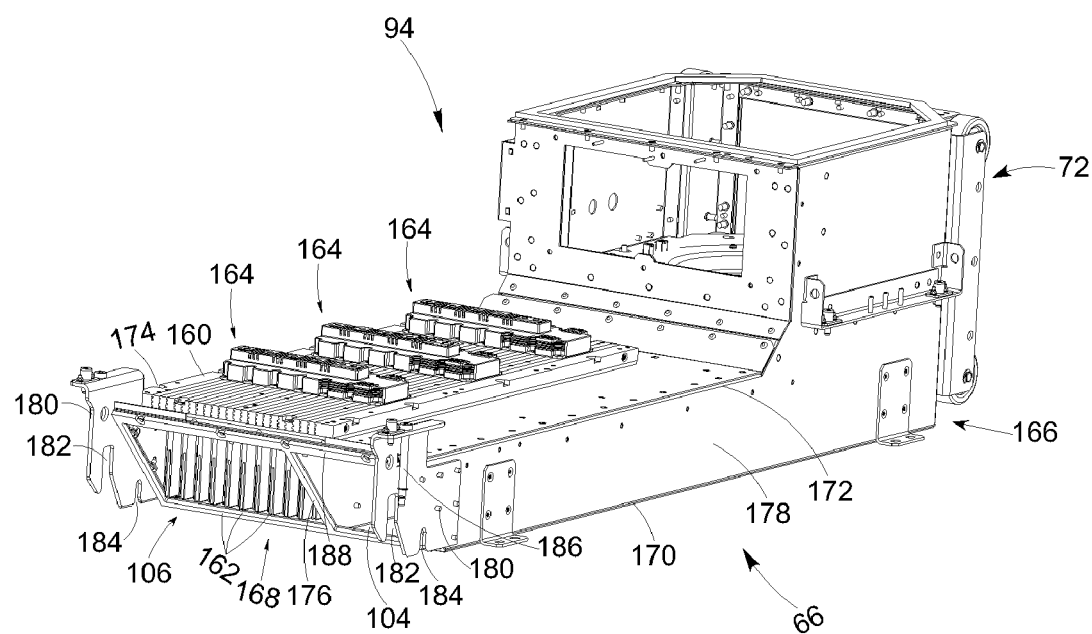
FIG. 6 is a perspective view of an exemplary embodiment of the inverter duct when extracted from the cabinet of FIG. 3.

FIG. 6 is a perspective view of an exemplary embodiment of the inverter duct 66 extracted from the cabinet 58 of FIG. 3. As illustrated, an inverter heat sink 160 having a plurality of heat sink fins 162 extending into the second inverter duct channel 106 is attached to the inverter duct 66. In addition, components 164 of the inverter 62 are attached to the inverter heat sink 160 on a side of the inverter heat sink 160 opposite the plurality of heat sink fins 162 such that the components 164 are external to the second inverter duct channel 106. As described above, cooling air flowing through the second inverter duct channel 106 dissipates and carries away heat generated by the components 164 of the inverter 62. In particular, heat generated by the components 164 of the inverter 62 flow through the inverter heat sink 160 and associated heat sink fins 162 into the second inverter duct channel 106. The heat is then transferred from the heat sink fins 162 to cooling air flowing from an upstream end 166 of the inverter duct 66 and carried to a downstream end 168 of the inverter duct 66 through the second inverter duct channel 106.

As illustrated, the inverter duct 66 includes an angled downstream end 168 that mates with the angled upstream end 138 of the converter duct 68 described above. In particular, in certain embodiments, the downstream end 168 of the inverter duct 66 extends out from a back wall 170 of the inverter duct 66 to a front wall 172 of the inverter duct 66 at an oblique angle (i.e., not a right angle). More specifically, the downstream end 168 of the inverter duct 66 is at an obtuse angle (e.g., greater than 90° angle) with respect to the back wall 170 of the inverter duct 66, and is at an acute angle (e.g., less than 90° angle) with respect to the front wall 172 of the inverter duct 66. For example, in certain embodiments, the angle of the downstream end 168 with respect to the back wall 170 of the inverter duct 66 is approximately 135°, whereas the angle of the downstream end 168 with respect to the front wall 172 of the inverter duct 66 is approximately 45°. The 45° and 135° angles (or, indeed, any suitable supplementary angles) optimize the sealing of both the back wall 170 and the front wall 172 with the downstream end 168 of the inverter duct 66.

The second inverter duct channel 106 of the inverter duct 66 is defined between the front and back walls 172, 170 of the inverter duct 66, a right wall 174 of the inverter duct 66, and an interior partition wall 176 extending from the front wall 172 to the back wall 170 within the inverter duct 66. The first inverter duct channel 104 of the inverter duct 66 is defined between the front and back walls 172, 170 of the inverter duct 66, a left wall 178 of the inverter duct 66, and the interior partition wall 176 extending from the front wall 172 to the back wall 170 within the inverter duct 66.

The inverter duct 66 includes brackets 180 attached to both the right and left walls 174, 178 of the inverter duct 66. The brackets 180 constrain motion in orthogonal directions to ensure proper duct alignment and seal compression. In particular, the brackets 180 are configured to draw the inverter duct 66 and the converter duct 68 into sealed engagement via a set of fasteners. The brackets 180 are integrated structural components of the duct system 70 and provide a path for load transfer during lifting or raising from horizontal to vertical orientations. In addition, the brackets 180 also include lifting holes to lift the inverter duct 66 when the inverter duct 66 is decoupled from the converter duct 68. Besides joining the inverter and converter ducts 66, 68 together, the brackets 180 also provide a means to secure the motor drive to the cabinet 58 of FIG. 3, as well as providing a path for load transfer when lifting the entire motor drive.

As described in greater detail below, the brackets 180 are configured to mate with the keys 152 and alignment features 158 of the converter duct 68 described above with respect to FIG. 5. In particular, the brackets 180 include generally open-ended rectangular-shaped or obround slots 182 configured to mate with the generally rectangular-shaped keys 152 of the converter duct 68 to align the inverter duct 66 with the converter duct 68 when the inverter duct 66 and the converter duct 68 are assembled together. In addition, the brackets 180 include at least one alignment slot 184 configured to mate with the alignment features 158 of the converter duct 68 to align the inverter duct 66 with the converter duct 68 when the inverter duct 66 and the converter duct 68 are assembled together.

Each of the brackets 180 may be associated with a respective pin 186. In particular, the pins 186 may be configured to mate with the keyholes 156 extending at least partially through the keys 152 of the converter duct 68. When the inverter duct 66 and the converter duct 68 are assembled together, the pins 186 may be attached to the keys 152 of the converter duct 68, thereby securing the inverter duct 66 to the converter duct 68. Any suitable attachment features may be used for the keyholes 156 of the keys 152 of the converter duct 68 and the pins 186 of the brackets 180 of the inverter duct 66. For example, in certain embodiments, the keyholes 156 and the pins 186 may be threaded such that the pins 186 are screwed into the keyholes 156. It should be noted that, in certain embodiments, the inverter duct 66 may include the keys and alignment features, and the converter duct 68 may include the brackets, slots, and pins. In other words, the attachment features of the inverter duct 66 and the converter duct 68 may be reversed from the embodiments illustrated in FIGS. 5 and 6.

In addition, in certain embodiments, a gasket-like seal 188 may be attached to the downstream end 168 of the inverter duct 66 such that the seal 188 is compressed between and separates the inverter duct 66 from the converter duct 68 when the inverter duct 66 and the converter duct 68 are assembled together. The seal 188 provides sealing capabilities that maintain the air flow through the first and second duct channel paths 128, 130 described above with respect to FIG. 4 with little to no leakage. In addition, the seal 188 prevents ingress of debris into the cabinet 58 of FIG. 3 from the first and second duct channel paths 128, 130, thereby protecting sensitive components in the cabinet 58. In particular, the seal 188 forms a NEMA 12/IP54 seal without the use of adhesive sealants, while also eliminating the need for restrictive intake filters. The seal 188 also includes gasket stops to prevent over compression and to transfer some of the loads between the inverter duct 66 and the converter duct 68. In particular, in certain embodiments, the seal 188 is comprised of a generally compressible material, such as foam or the like.

Figure 7:
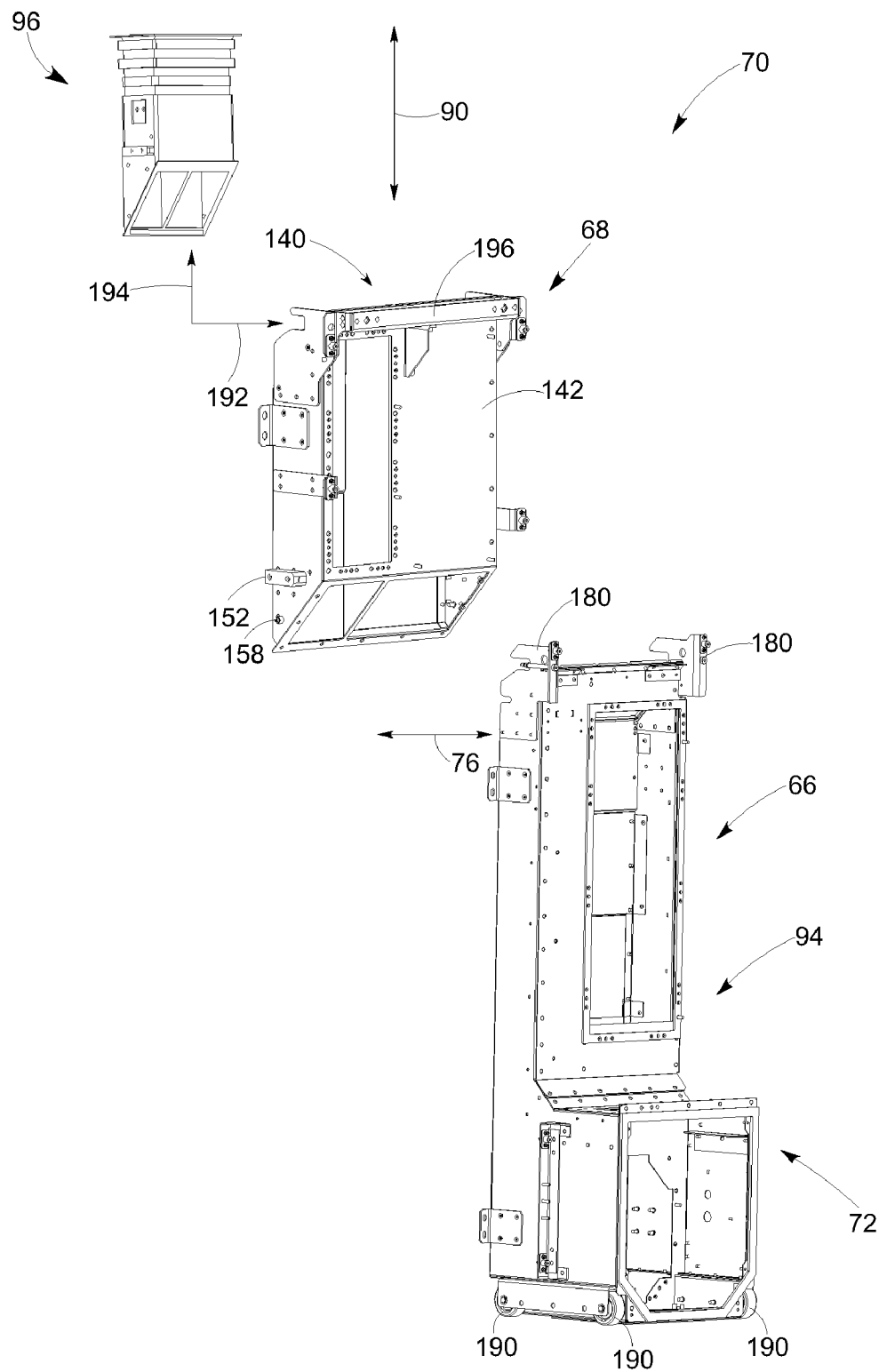
FIG. 7 is a perspective exploded view of an exemplary embodiment of the inverter duct, converter duct, inlet duct, and exhaust duct.
Figure 8:
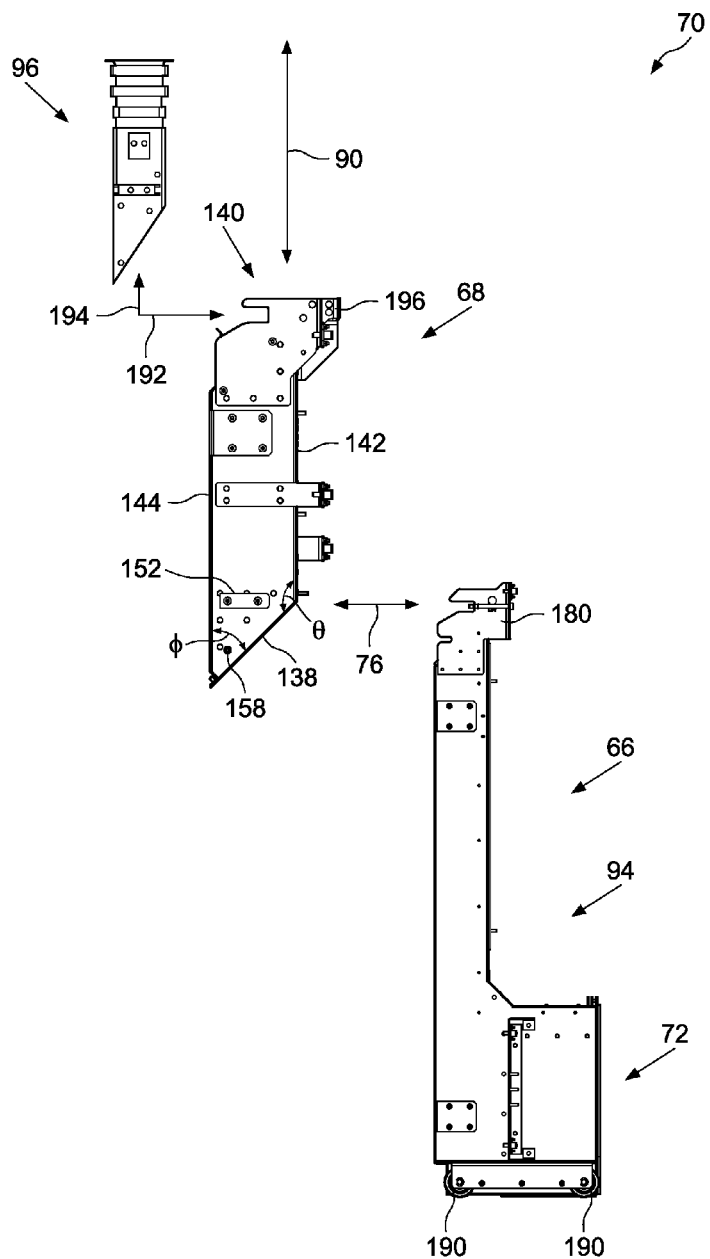
FIG. 8 is a side exploded view of an exemplary embodiment of the inverter duct, converter duct, inlet duct, and exhaust duct.

FIGS. 7 and 8 are perspective and side exploded views of an exemplary embodiment of the inverter duct 66, converter duct 68, inlet air duct 72, and exhaust duct 96. As illustrated by arrow 76, the inverter duct 66 and the inlet air duct 72 may be separated from the converter duct 68. In particular, as described above, the inverter duct 66 and the inlet air duct 72 may be rolled into and out of the cabinet 58 described above with respect to FIG. 3. To facilitate the rolling, the inlet air duct 72 may include wheels 190 that may be rolled onto an auxiliary cart or platform 80 with respect to FIG. 3. When the inverter duct 66 is rolled out of the cabinet 58, the brackets 180 of the inverter duct 66 are detached from the keys 152 and the alignment features 158 of the converter duct 68. Conversely, when the inverter duct 66 is rolled back into the cabinet 58, the brackets 180 of the inverter duct 66 are attached to the keys 152 and the alignment features 158 of the converter duct 68, providing both alignment and structural support of the inverter duct 66 with respect to the converter duct 68. Thus, by simply sliding the inverter duct 66 into the cabinet 58 and engaging the inverter duct 66 with the converter duct 68, the components function together to align and seal the first and second duct channel paths 128, 130.

In addition, as described in greater detail below, the exhaust duct 96 and the converter duct 68 may include similar attachment features as those between the inverter duct 66 and the converter duct 68. As illustrated by arrows 192 and 194, the exhaust duct 96 may be detached from the converter duct 68 and lifted through the top of the cabinet 58 of FIG. 3. In addition, once the exhaust duct 96 has been removed, the converter duct 68 may also be lifted through the top of the cabinet 58 of FIG. 3, as illustrated by arrow 90. In particular, in certain embodiments, the converter duct 68 may include a lifting bar 196 on the front wall 142 of the converter duct 68 near the downstream end 140 of the converter duct 68, which facilitates lifting of the converter duct 68 and attached ducts and/or components. When assembling the motor drive 60, the converter duct 68 may first be inserted back into the cabinet 58 of FIG. 3, as illustrated by arrow 90, and attached within the cabinet 58. Once the converter duct 68 has been inserted and attached, the exhaust duct 96 may be inserted back into the cabinet 58 of FIG. 3 and attached to the converter duct 68, as illustrated by arrow 194 and 192. However, in other embodiments, the converter duct 68 may be rolled into and out of the cabinet 58 of FIG. 3 while attached to the inverter duct 66 and the inlet air duct 72, and the exhaust duct 96 may remain in the cabinet 58.

Figure 9:
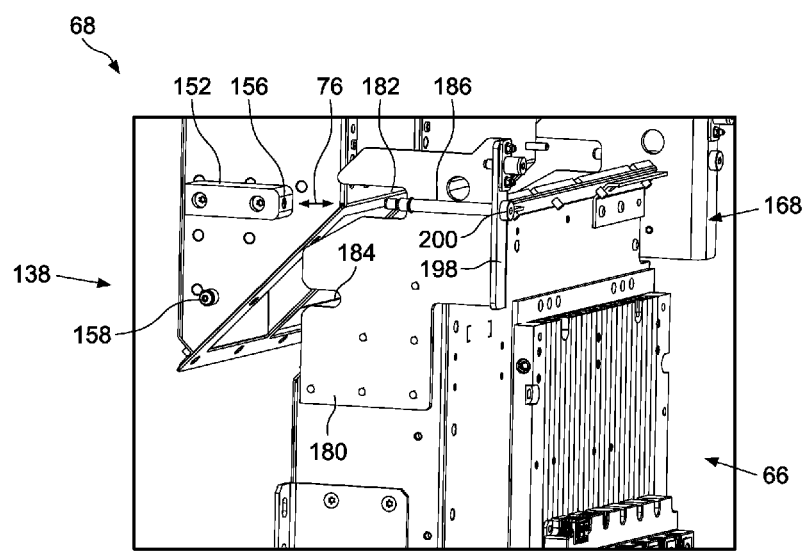
FIG. 9 is a partial perspective view of an exemplary embodiment of the inverter duct and the converter duct when detached from each other.
Figure 10:
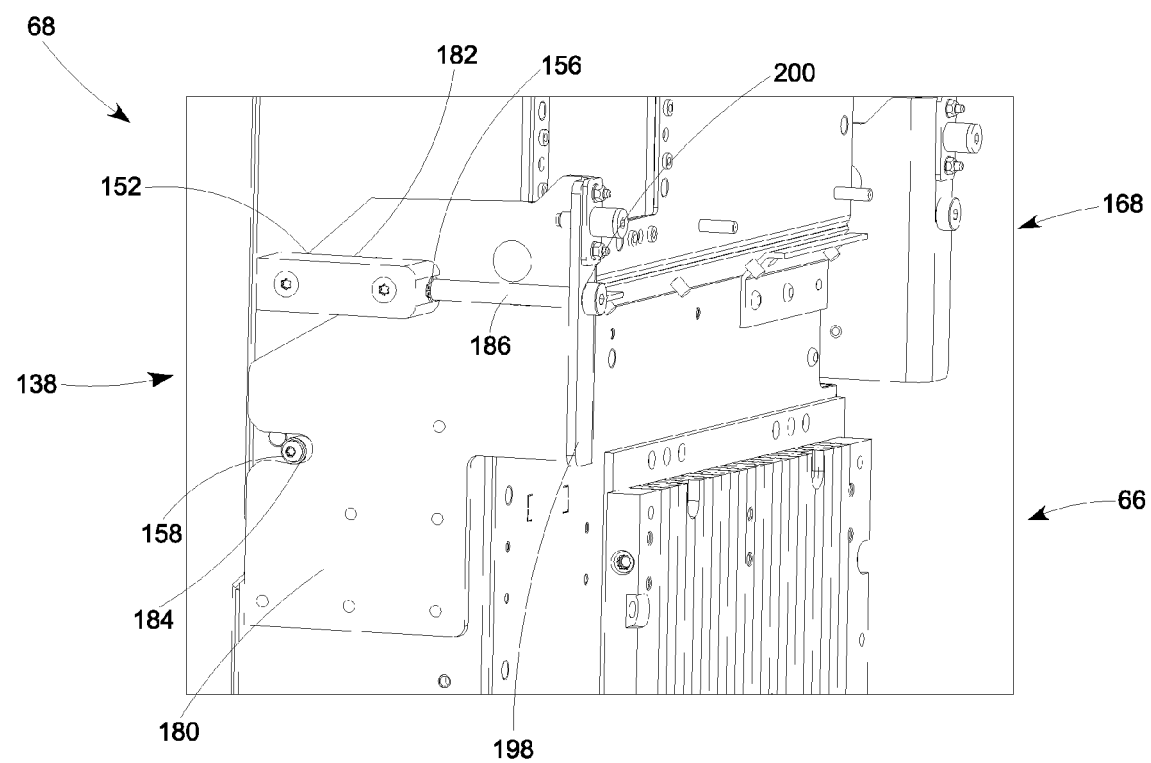
FIG. 10 is a partial perspective view of an exemplary embodiment of the inverter duct and the converter duct when attached to each other.

As described above, the inverter duct 66 and the converter duct 68 are attachable and detachable from each other at the downstream end 168 of the inverter duct 66 and the upstream end 138 of the converter duct 68. FIG. 9 is a partial perspective view of an exemplary embodiment of the inverter duct 66 and the converter duct 68 when detached from each other, and FIG. 10 is a partial perspective view of an exemplary embodiment of the inverter duct 66 and the converter duct 68 when attached to each other. As illustrated by arrow 76, the inverter duct 66 and the converter duct 68 may be attached and detached by aligning the generally rectangular-shaped keys 152 of the converter duct 68 with the generally rectangular-shaped slots 182 of the brackets 180 of the inverter duct 66, aligning the alignment features 158 of the converter duct 68 with the alignment slots 184 of the brackets 180 of the inverter duct 66, and inserting and attaching the pins 186 of the inverter duct 66 within the keyholes 156 of the keys 152 of the converter duct 68. In particular, the obround shape of the keys 152 facilitates the alignment of the inverter duct 66 with the converter duct 68. More specifically, because of the slightly rounded edges of the keys 152, slight variations in the alignment will be corrected relatively smoothly than if sharp edges were used. In addition, in other embodiments, trapezoidal-shaped keys 152 may be used with trapezoidal-shaped alignment slots 182. Although the majority of the brackets 180 are parallel with the right and left walls 174, 178 of the inverter duct 66, the brackets 180 may also include relatively narrow sections 198 that extend away from the inverter duct 66 orthogonal from the right and left walls 174, 178 of the inverter duct 66, wherein the narrow sections 198 are used to secure the inverter and converter ducts 66, 68 to the cabinet 58 of FIG. 3. The pins 186 may be inserted into holes 200 in the narrow bracket sections 198 before being inserted into and attached to the keyholes 156 of the keys 152 of the converter duct 68. Although described herein as being used in motor drive systems, the disclosed techniques for attaching air duct systems may be extended to other applications, such as heating, ventilation, and air conditioning (HVAC) applications.

Figure 11:
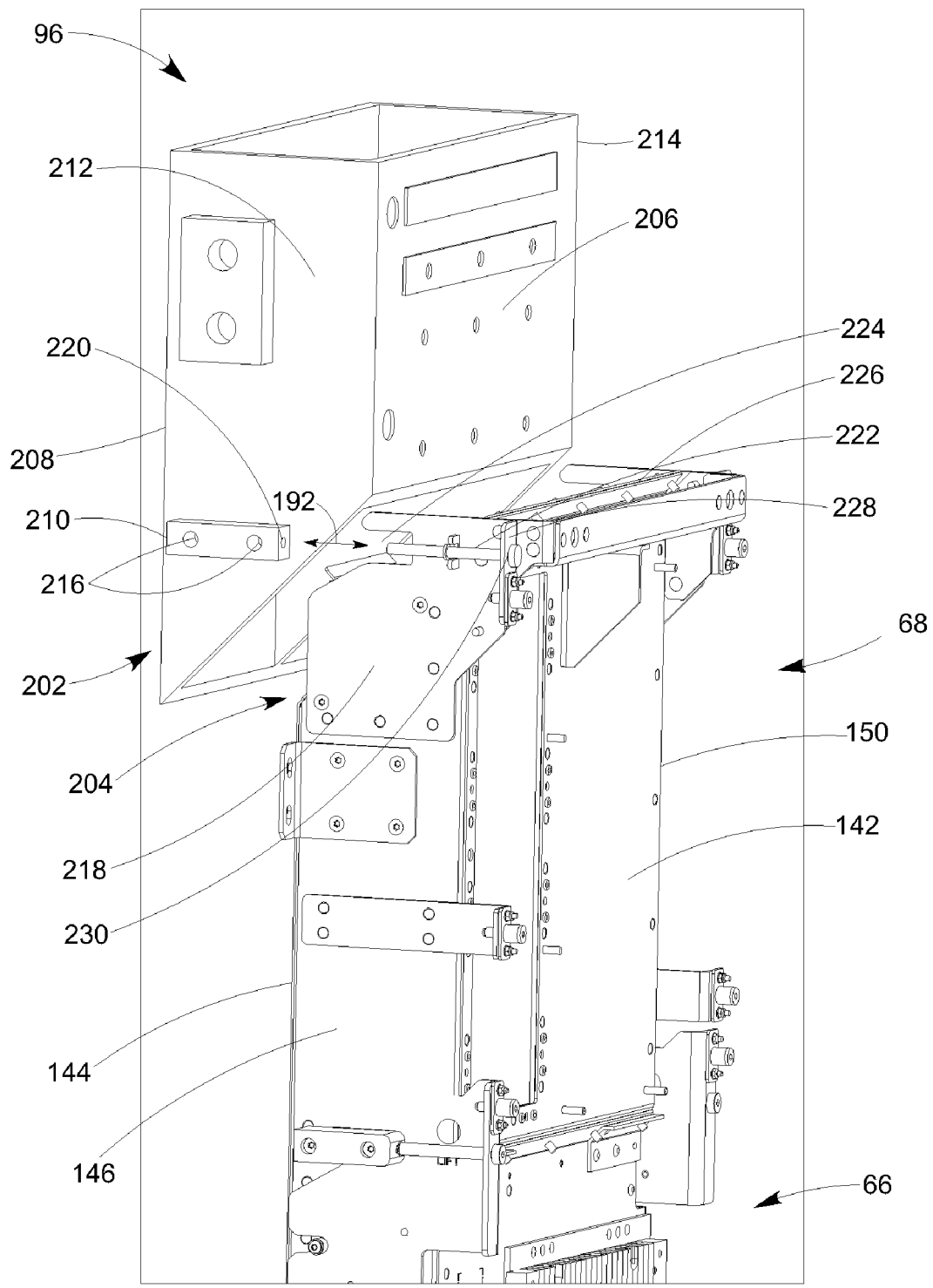
FIG. 11 is a partial perspective view of an exemplary embodiment of the exhaust duct, the converter duct, and the inverter duct.

As described above with respect to FIGS. 7 and 8, the exhaust duct 96 may also be detached from and attached to the converter duct 68. Indeed, in certain embodiments, the exhaust duct 96 and the converter duct 68 may also include attachment features similar to those used to attach the converter duct 68 and the inverter duct 66. FIG. 11 is a partial perspective view of an exemplary embodiment of the exhaust duct 96, the converter duct 68, and the inverter duct 66. As illustrated, the exhaust duct 96 includes an angled upstream end 202 that mates with a downstream end 204 of the converter duct 68. In particular, in certain embodiments, the upstream end 202 of the exhaust duct 96 extends out from a front wall 206 of the exhaust duct 96 to a back wall 208 of the exhaust duct 96 at an oblique angle (i.e., not a right angle). More specifically, the upstream end 202 of the exhaust duct 96 is at an obtuse angle (e.g., greater than 90° angle) with respect to the front wall 206 of the exhaust duct 96, and is at an acute angle (e.g., less than 90° angle) with respect to the back wall 208 of the exhaust duct 96. For example, in certain embodiments, the angle of the upstream end 202 with respect to the front wall 206 of the exhaust duct 96 is approximately 135°, whereas the angle of the upstream end 202 with respect to the back wall 208 of the exhaust duct 96 is approximately 45°. The 45° and 135° angles optimize the sealing of both the front wall 206 and the back wall 208 with the upstream end 202 of the exhaust duct 96.

The exhaust duct 96 includes generally rectangular-shaped or obround keys 210 attached to both left and right walls 212, 214 of the exhaust duct 96. In particular, in certain embodiments, the keys 210 are attached to the left and right walls 212, 214 of the exhaust duct 96 via two or more cap screws 216. The keys 210 are configured to mate with brackets 218 attached to the converter duct 68 to align the exhaust duct 96 with the converter duct 68 when the exhaust duct 96 and the converter duct 68 are assembled together. In addition, the keys 210 include keyholes 220 extending at least partially through the keys 210 from front to back. The keyholes 220 are configured to mate with pins 222 that help secure the exhaust duct 96 to the converter duct 68 when the exhaust duct 96 and the converter duct 68 are assembled together. Although not illustrated in the embodiment of FIG. 11, in certain embodiments, the exhaust duct 96 may also include at least one additional alignment feature extending from the left and right walls 212, 214 of the exhaust duct 96. The alignment features may also be configured to mate with the brackets 218 attached to the converter duct 68 to align the exhaust duct 96 with the converter duct 68 when the exhaust duct 96 and the converter duct 68 are assembled together.

As illustrated, the converter duct 68 includes an angled downstream end 204 that mates with the angled upstream end 202 of the exhaust duct 96 described above. In particular, in certain embodiments, the downstream end 204 of the converter duct 68 extends out from the back wall 144 of the converter duct 68 to the front wall 142 of the converter duct 68 at an oblique angle (i.e., not a right angle). More specifically, the downstream end 204 of the converter duct 68 is at an obtuse angle (e.g., greater than 90° angle) with respect to the back wall 144 of the converter duct 68, and is at an acute angle (e.g., less than 90° angle) with respect to the front wall 142 of the converter duct 68. For example, in certain embodiments, the angle of the downstream end 204 with respect to the back wall 144 of the converter duct 68 is approximately 135°, whereas the angle of the downstream end 204 with respect to the front wall 142 of the converter duct 68 is approximately 45°. The 45° and 135° angles (or, indeed, any suitable supplementary angles) optimize the sealing of both the front wall 142 and the back wall 144 with the downstream end 204 of the converter duct 68.

The converter duct 68 includes a bracket 218 attached to both the left and right walls 146, 150 of the converter duct 68. The brackets 218 constrain motion in orthogonal directions to ensure proper duct alignment and seal compression. In particular, the brackets 218 are configured to draw the exhaust duct 96 and the converter duct 68 into sealed engagement via a set of fasteners. The brackets 218 are integrated structural components of the duct system 70 and provide a path for load transfer during lifting of the motor drive 60. The brackets 218 are configured to mate with the keys 210 of the exhaust duct 96 described above. In particular, the brackets 218 include generally open-ended rectangular-shaped or obround slots 224 configured to mate with the generally rectangular-shaped keys 210 of the exhaust duct 96 to align the converter duct 68 with the exhaust duct 96 when the converter duct 68 and the exhaust duct 96 are assembled together. However, as described above, other shapes may be used for the keys 210 and the slots 224. In addition, although not illustrated in the embodiment of FIG. 11, the brackets 218 may also include alignment slots configured to mate with alignment features of the exhaust duct 96 to align the converter duct 68 with the exhaust duct 96 when the converter duct 68 and the exhaust duct 96 are assembled together.

Each of the brackets 218 may be associated with a respective pin 222. In particular, the pins 222 may be configured to mate with the keyholes 220 extending at least partially through the keys 210 of the exhaust duct 96. When the converter duct 68 and the exhaust duct 96 are assembled together, the pins 222 may be attached to the keys 210 of the exhaust duct 96, thereby securing the converter duct 68 to the exhaust duct 96. Any suitable attachment features may be used for the keyholes 220 of the keys 210 of the exhaust duct 96 and the pins 222 of the brackets 218 of the converter duct 68. For example, in certain embodiments, the keyholes 220 and the pins 222 may be threaded such that the pins 222 are screwed into the keyholes 220.

In addition, in certain embodiments, a gasket-like seal 226 may be attached to the downstream end 204 of the converter duct 68 such that the seal 226 separates the converter duct 68 from the exhaust duct 96 when the converter duct 68 and the exhaust duct 96 are assembled together. The seal 226 provides sealing capabilities that maintains the air flow through the first and second duct channel paths 128, 130 described above with respect to FIG. 4 with little to no leakage. In addition, the seal 226 prevents ingress of debris into the cabinet 58 of FIG. 3 from the first and second duct channel paths 128, 130, thereby protecting sensitive components in the cabinet 58. In particular, the seal 226 forms a NEMA 12/IP54 seal without the use of adhesive sealants, while also eliminating the need for restrictive intake filters. The seal 226 also includes gasket stops to prevent over compression and to transfer some of the loads between the converter duct 68 and the exhaust duct 96. In particular, in certain embodiments, the seal 226 is comprised of a generally compressible material, such as foam or the like.

As illustrated by arrow 192, the exhaust duct 96 and the converter duct 68 may be attached and detached by aligning the generally rectangular-shaped keys 210 of the exhaust duct 96 with the generally rectangular-shaped slots 224 of the brackets 218 of the converter duct 68, and inserting and attaching the pins 222 of the converter duct 68 within the keyholes 220 of the keys 210 of the exhaust duct 96. As described above, other shapes may be used for the keys 210 and the slots 224. Although the majority of the brackets 218 are parallel with the left and right walls 146, 150 of the converter duct 68, the brackets 218 also include relatively narrow sections 228 that extend away from the converter duct 68 orthogonal from the left and right walls 146, 150 of the converter duct 68, wherein the narrow sections 228 are used to secure the converter and exhaust ducts 68, 96 to the cabinet 58 of FIG. 3. The pins 222 are inserted into holes 230 in the narrow bracket sections 228 before being inserted into and attached to the keyholes 220 of the keys 210 of the exhaust duct 96.

As described above with respect to FIGS. 4 through 6, the first duct channel path 128 is dedicated to cooling the converter heat sink 132 associated with the converter 64, whereas the second duct channel path 130 is dedicated to cooling the inverter heat sink 160 associated with the inverter 62. In particular, the first converter duct channel 112 of the converter duct 68 houses the converter heat sink 132, and the second inverter duct channel 106 of the inverter duct 66 houses the inverter heat sink 160. More specifically, the heat sink fins 134 of the converter heat sink 132 are disposed within the first converter duct channel 112 of the converter duct 68, and the heat sink fins 162 of the inverter heat sink 160 are disposed within the second inverter duct channel 106.

Figure 12:
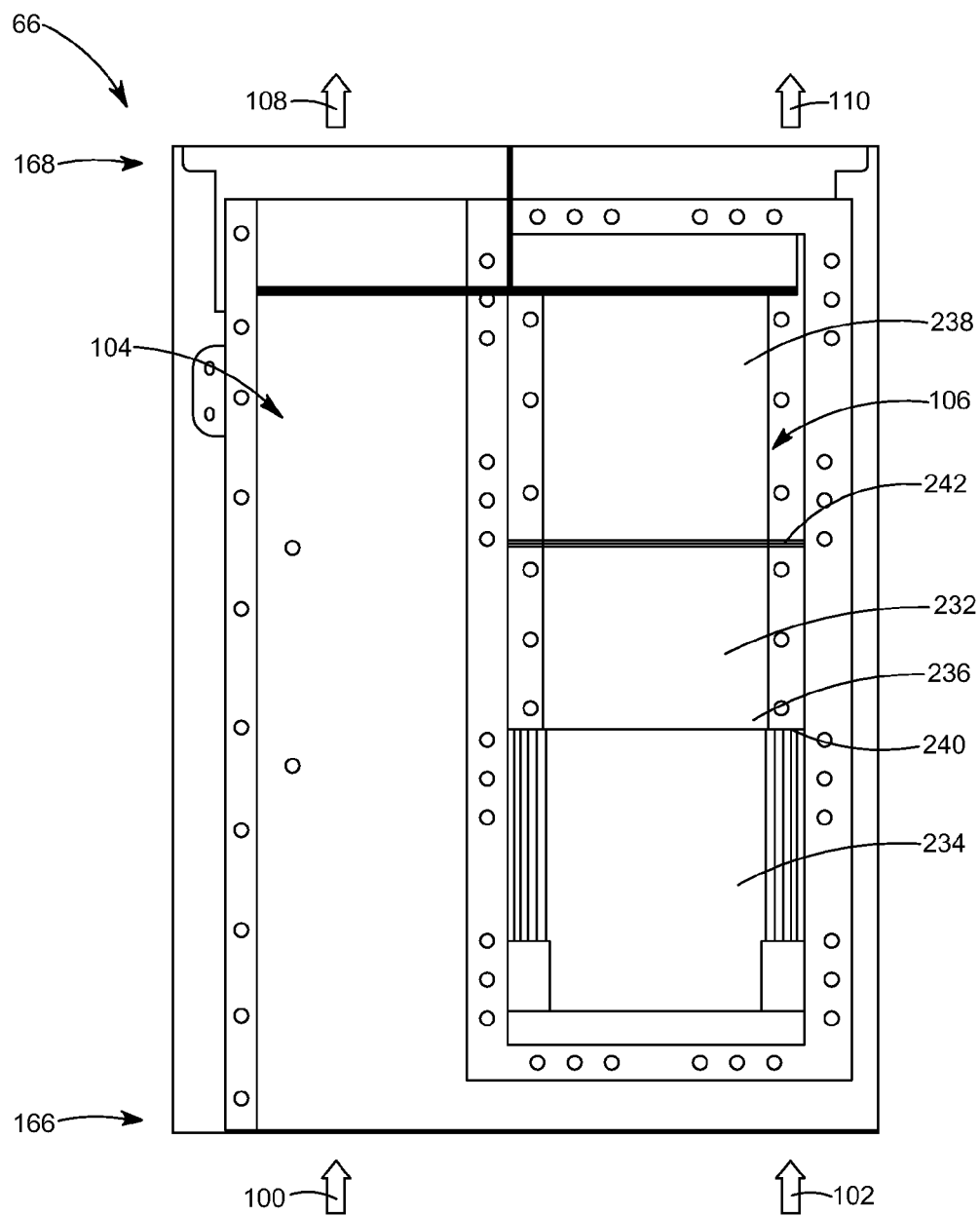
FIG. 12 is a front view of an exemplary embodiment of the inverter duct.
Figure 13:
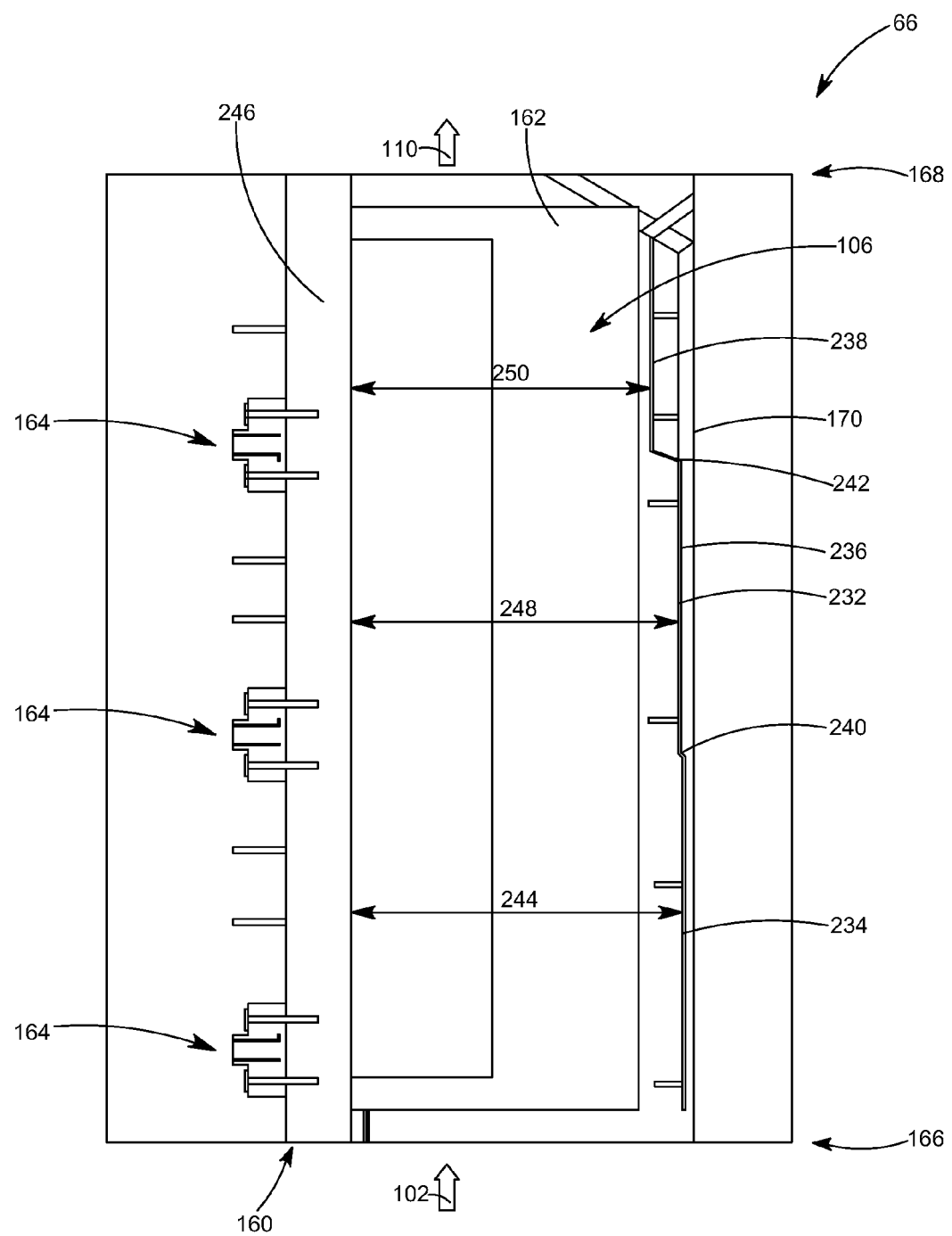
FIG. 13 is a cross-sectional side view of an exemplary embodiment of the second inverter duct channel of the inverter duct.

FIG. 12 is a front view of an exemplary embodiment of the inverter duct 66, and FIG. 13 is a cross-sectional side view of an exemplary embodiment of the second inverter duct channel 106 of the inverter duct 66. As illustrated, the second inverter duct channel 106 of the inverter duct 66 includes a baffled wall 232 near the back wall 170 of the inverter duct 66. In addition to providing structural strength to the inverter duct 66, the baffled wall 232 includes multiple sections configured to gradually reduce the cross-sectional area of the second inverter duct channel 106 as the cooling air 102, 110 flows from the upstream end 166 of the inverter duct 66 to the downstream end 168 of the inverter duct 66. In particular, the cross-section of the illustrated baffled wall 232 includes first, second, and third baffled wall sections 234, 236, 238 separated by first and second baffles 240, 242 such that the first, second, and third baffled wall sections 234, 236, 238 generally correspond to the three components 164 (e.g., switching modules) of the inverter 62. However, in other embodiments, any number of baffled wall sections may be used for the baffled wall 232. For example, the baffled wall 232 may include 2, 3, 4, 5, 6, 7, 8, 9, 10, or even more baffled wall sections.

As illustrated, both of the baffles 240, 242 may transition at an angle of approximately 45° from one baffled wall section to the next. For example, the first baffle 240 may transition at an angle of approximately 45° from the first baffled wall section 234 to the second baffled wall section 236, and the second baffle 242 may transition at an angle of approximately 45° from the second baffled wall section 236 to the third baffled wall section 238. However, it should be noted that the first and second baffles 240, 242 may transition between baffled wall sections at other angles in other embodiments. Because of the first and second baffles 240, 242, a distance 244 from a base 246 of the inverter heat sink 160 to the first baffled wall section 234 is slightly greater than a distance 248 from the base 246 of the inverter heat sink 160 to the second baffled wall section 236 which is, in turn, slightly greater than a distance 250 from the base 246 of the inverter heat sink 160 to the third baffled wall section 238.

Because of the gradual decrease in the distance from the base 246 of the inverter heat sink 160 to the baffled wall 232, the cross-sectional area of the second inverter duct channel 106 through which the cooling air 102, 110 flows is gradually reduced. As such, the velocity of the cooling air 110 near the downstream end 168 of the second inverter duct channel 106 will be greater than the velocity of the cooling air 102 near the upstream end 166 of the second inverter duct channel 106. In particular, a portion of the cooling air bypasses the heat sink fins 162 near the first baffled wall section 234 and flows across the heat sink fins 162 near the second and third baffled wall sections 236, 238, whereas another portion of the cooling air bypasses the heat sink fins 162 near the second baffled wall section 236 and flows across the heat sink fins 162 near the third baffled wall section 238. In other words, a portion of the cooling air flows directly through or between the heat sink fins 162, whereas some of the cooling air flows in the area between the heat sink fins 162 and the baffled wall 232. As the area between the heat sink fins 162 and the baffled wall 232 narrows because of the baffles 240, 242, some of the cooling air that was initially flowing near the baffled wall 232 will flow through the heat sink fins 162 at downstream locations. The baffles 240, 242 provide relatively smooth transitions in the air flow to reduce backpressure.

As a result of employing the baffled wall sections 234, 236, 238 as discussed above, the bypass air (which is at ambient temperature) is reintroduced at downstream locations to help reduce the temperature gradients from the upstream components 164 of the inverter 62 to the downstream components 164 of the inverter 62. More specifically, the baffled wall 232 may enable the temperature gradient to be maintained within 5° F. (e.g., from the upstream end 166 of the second inverter duct channel 106 to the downstream end 168 of the second inverter duct channel 106) depending on heat load and positioning of the components 164. Because of heat transfer from the heat sink fins 162, the cooling air 102, 110 may gradually increase in temperature as it flows through the second inverter duct channel 106. However, this increase in temperature may be at least partially offset because more cooling air 102, 110 is directed to flow directly between the heat sink fins 162 at downstream locations.

Figure 14:
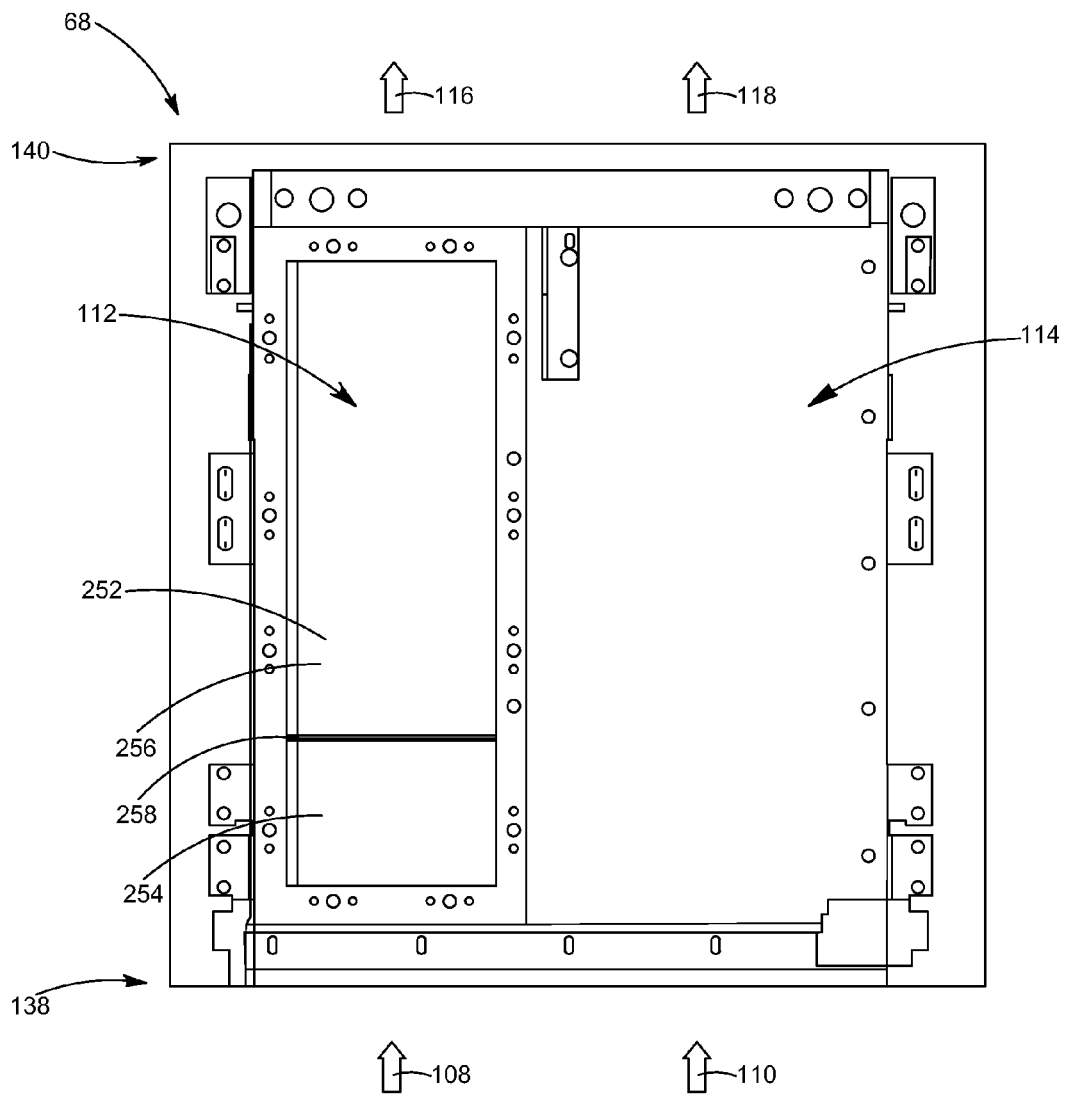
FIG. 14 is a front view of an exemplary embodiment of the converter duct.
Figure 15:
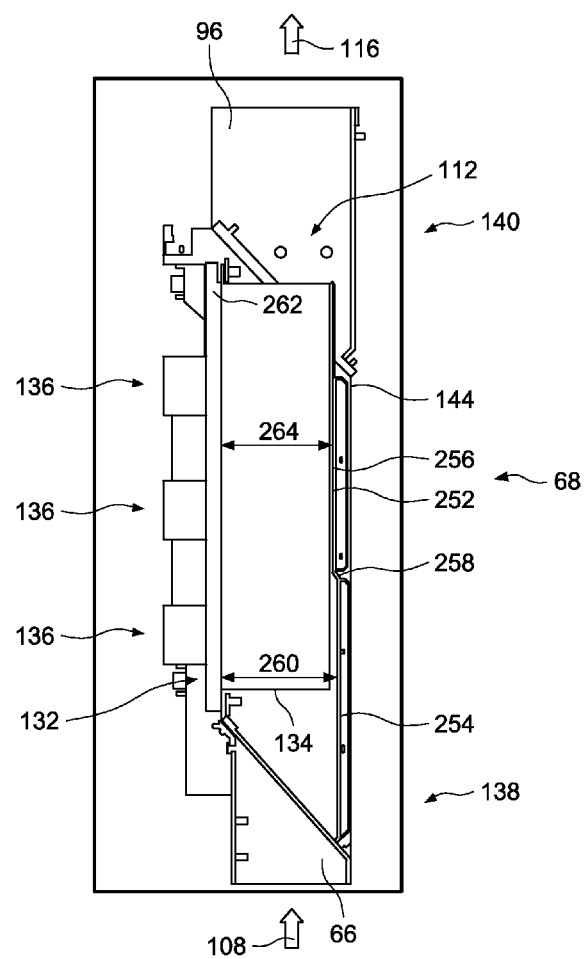
FIG. 15 is a cross-sectional side view of an exemplary embodiment of the first converter duct channel of the converter duct.

The first converter duct channel 112 of the converter duct 68 also includes a baffled wall similar to the baffled wall 232 in the second inverter duct channel 106 of the inverter duct 66. FIG. 14 is a front view of an exemplary embodiment of the converter duct 68, and FIG. 15 is a cross-sectional side view of an exemplary embodiment of the first converter duct channel 112 of the converter duct 68. As illustrated, the first converter duct channel 112 of the converter duct 68 includes a baffled wall 252 near the back wall 144 of the converter duct 68. In addition to providing structural strength to the converter duct 68, the baffled wall 252 includes multiple sections configured to gradually reduce the cross-sectional area of the first converter duct channel 112 as the cooling air 108, 116 flows from the upstream end 138 of the converter duct 68 to the downstream end 140 of the converter duct 68. In particular, the cross-section of the illustrated baffled wall 252 includes first and second baffled wall sections 254, 256 separated by a baffle 258. However, in other embodiments, any number of baffled wall sections may be used for the baffled wall 252. For example, the baffled wall 252 may include 2, 3, 4, 5, 6, 7, 8, 9, 10, or even more baffled wall sections.

As illustrated, the baffle 258 may transition at an angle of approximately 45° from the first baffled wall section 254 to the second baffled wall section 256. However, it should be noted that the baffle 258 may transition from the first baffled wall section 254 to the second baffled wall section 256 at other angles in other embodiments. Because of the baffle 258, a distance 260 from a base 262 of the converter heat sink 132 to the first baffled wall section 254 is slightly greater than a distance 264 from the base 262 of the converter heat sink 132 to the second baffled wall section 256. Because of the gradual decrease in the distance from the base 262 of the converter heat sink 132 to the baffled wall 252, the cross-sectional area of the first converter duct channel 112 through which the cooling air 108, 116 flows is gradually reduced. As such, the velocity of the cooling air 116 near the downstream end 140 of the first converter duct channel 112 will be greater than the velocity of the cooling air 108 near the upstream end 138 of the first converter duct channel 112. In particular, a portion of the cooling air bypasses the heat sink fins 134 near the first baffled wall section 254 and flows across the heat sink fins 134 near the second baffled wall section 256. In other words, a portion of the cooling air flows directly through the heat sink fins 134, whereas some of the cooling air flows in the area between the heat sink fins 134 and the baffled wall 252. Some of the cooling air flowing near the baffled wall 252 will flow through the heat sink fins 134 at downstream locations because of the baffle 258. The baffle 258 provides relatively smooth transitions in the air flow to reduce backpressure. In addition, in certain embodiments, the heat sink fins 134 of the converter heat sink 132 may extend into the exhaust duct 96 to maintain air flow through the heat sink fins 134 and to provide a smooth transition into the exhaust duct 96.

As a result of employing the baffled wall sections 254, 256 as discussed above, the bypass air (which is at ambient temperature) is reintroduced at downstream locations to help reduce the temperature gradients from the upstream components 136 of the converter 64 to the downstream components 136 of the converter 64. More specifically, the baffled wall 252 may enable the temperature gradient to be maintained within 5° F. (e.g., from the upstream end 138 of the first converter duct channel 112 to the downstream end 140 of the first converter duct channel 112) depending on heat load and positioning of the components 136. Because of heat transfer from the heat sink fins 134, the cooling air 108, 116 may gradually increase in temperature as it flows through the first converter duct channel 112. However, this increase in temperature may be at least partially offset because more cooling air 108, 116 is directed across the heat sink fins 134 at downstream locations.

Figure 16:
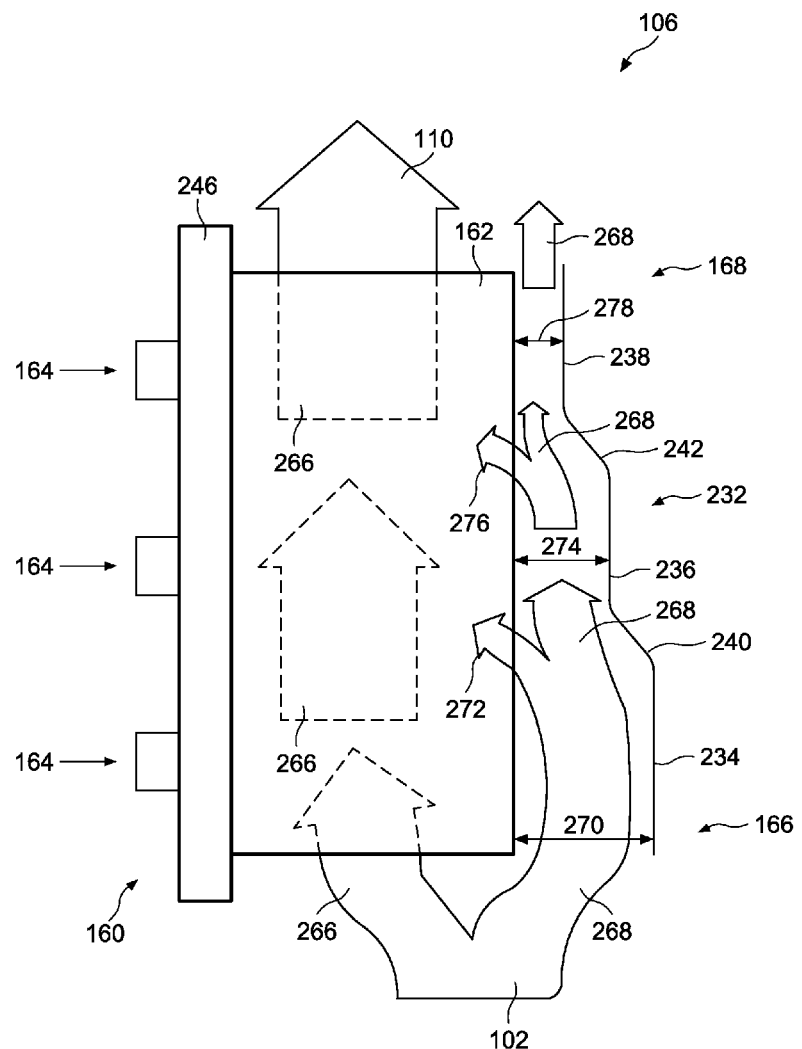
FIG. 16 is a conceptual side view of an exemplary embodiment of the inverter heat sink and the baffled wall of the inverter duct of FIG. 13.

FIG. 16 is a conceptual side view of an exemplary embodiment of the inverter heat sink 160 and the baffled wall 232 of the inverter duct 66 of FIG. 13, illustrating how the cooling air flows are directed across the heat sink fins 162 by the baffled wall 232. It should be noted that the relative dimensions illustrated in FIG. 16 are somewhat exaggerated in order to illustrate how the cooling air flows are affected by the baffled wall 232. As illustrated, a heat sink portion 266 of the cooling air 102 flowing into the second inverter duct channel 106 may directly flow across and between the heat sink fins 162 of the inverter heat sink 160, whereas a baffle portion 268 of the cooling air 102 flowing into the second inverter duct channel 106 may bypass the heat sink fins 162 of the inverter heat sink 160 through a distance 270 between the heat sink fins 162 and the first baffled wall section 234. A first portion 272 of the baffle portion 268 of cooling air may introduce ambient air just upstream of the second (e.g., middle) component 164 of the inverter 62, and may rejoin the heat sink portion 266 flowing across and between the heat sink fins 162 near where the heat sink fins 162 align with the first baffle 240 whereas some of the baffle portion 268 of cooling air may continue to bypass the heat sink fins 162 through a distance 274 between the heat sink fins 162 and the second baffled wall section 236. In addition, a second portion 276 of the baffle portion 268 of cooling air may introduce ambient air just upstream of the third (e.g., downstream) component 164 of the inverter 62, and may rejoin the heat sink portion 266 flowing across and between the heat sink fins 162 near where the heat sink fins 162 align with the second baffle 242, whereas some of the baffle portion 268 of cooling air may continue to bypass the heat sink fins 162 through a distance 278 between the heat sink fins 162 and the third baffled wall section 238. The distance 278 between the heat sink fins 162 and the third baffled wall section 238 may also be designed to adjust the backpressure (e.g., balance the air flow between the air flow channels). Finally, the remainder of the baffle portion 268 may exit the second inverter duct channel 106. As such, more cooling air is directed across the heat sink fins 162 of the inverter heat sink 160 toward the downstream end 168 of the second inverter duct channel 106 than toward the upstream end 166 of the second inverter duct channel 106. The same type of distribution of cooling air will occur with respect to the heat sink fins 134 of the converter heat sink 132 and the baffled wall 252 illustrated in FIG. 15.

Figure 17:
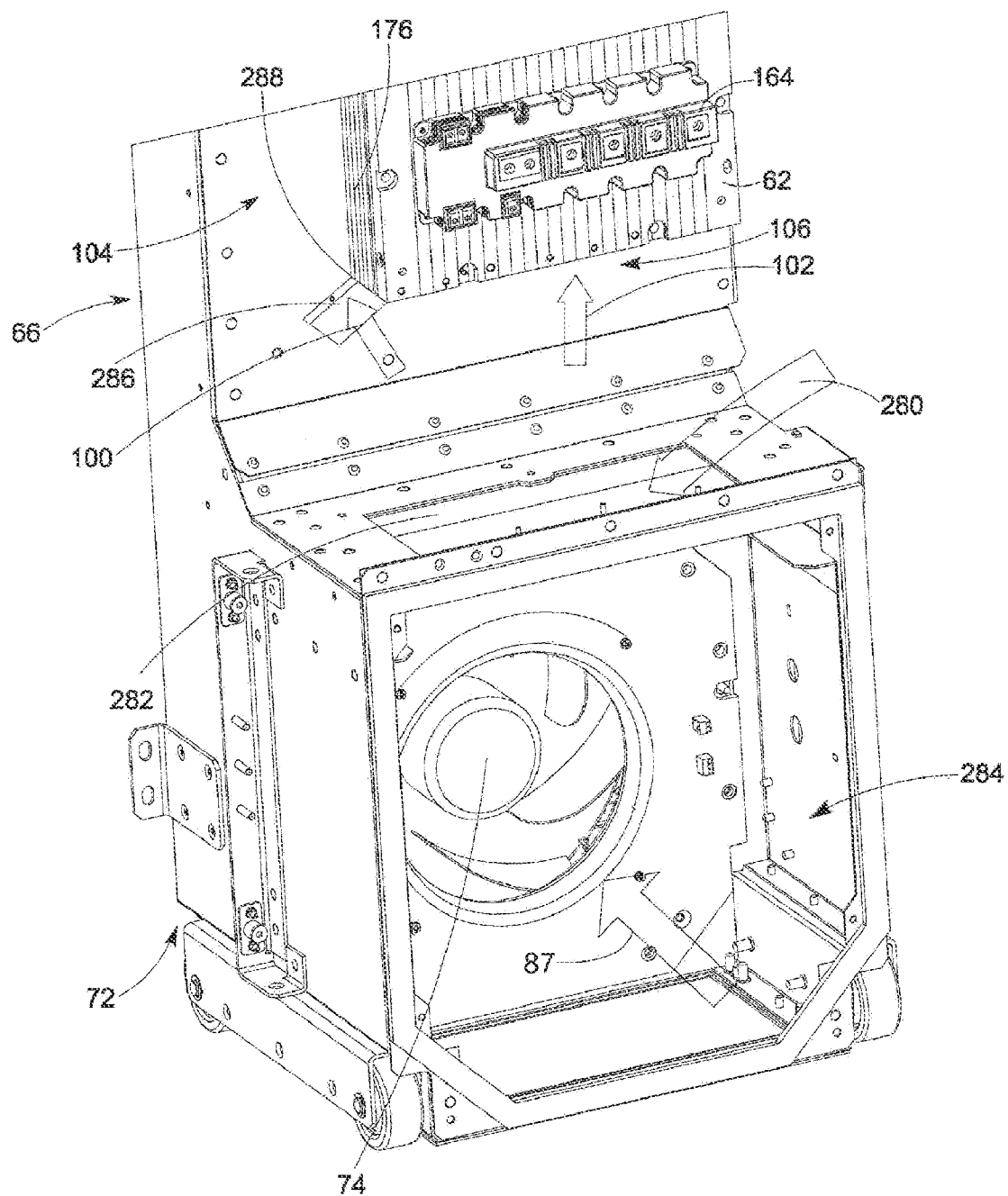
FIG. 17 is a partial perspective view of an exemplary embodiment of the inverter duct and the inlet air duct.
Figure 18:
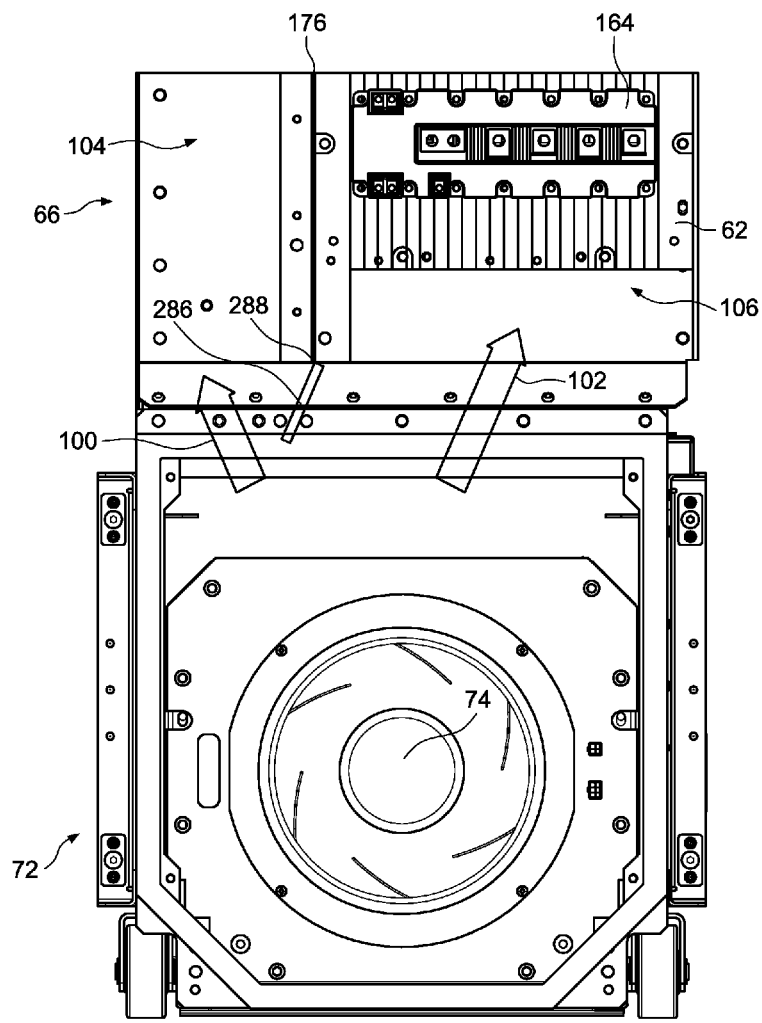
FIG. 18 is a partial cross-sectional side view of an exemplary embodiment of the inverter duct and the inlet air duct.

As described above, the inverter duct 66 may be attached to an inlet air duct 72 that receives ambient air and blows the air through the parallel duct channel paths 128, 130 of FIG. 4. FIGS. 17 and 18 are a partial perspective view and a partial cross-sectional side view of an exemplary embodiment of the inverter duct 66 and the inlet air duct 72. As illustrated by arrow 280, inlet air may be received (e.g., through the vents 92 of the cabinet 58 illustrated in FIG. 3) through an aperture 282 in the inlet air duct 72. In certain embodiments, a DC line choke may be held in place within the aperture 282, and may be cooled by the inlet air 280. In addition, inlet air 87 may be received into an interior volume 284 of the inlet air duct 72 through a vent in the cabinet door 78 of FIG. 3 directly in front of the blower 74. The inlet air 87 from the interior volume 284 may be blown by the blower 74 through the first inverter duct channel 104 and the second inverter duct channel 106 of the inverter duct 66, respectively, as the first air flow 100 and the second air flow 102 described above. In addition, in certain embodiments, a guide vane 286 may be attached to a base 288 of the interior partition wall 176 of the inverter duct 66. The guide vane 286 will control the flow of cooling air through the first and second duct channel paths 128, 130. More specifically, the guide vane 286 will balance the flow of the inlet air 87 blown by the blower 74 between the first and second air flows 100, 102. In particular, in certain embodiments, the guide vane 286 may be rotated about the base 288 of the interior partition wall 176 to selectively adjust the amount of cooling air divided between the first and second duct channel paths 128, 130. The rotational positioning of the guide vane 286 may be adjusted manually or automatically prior to or during operation of the motor drive 60. For example, the guide vane 286 may tune the flow of cooling air such that more cooling air is directed through the second duct channel path 130 and over the inverter heat sink 160 than through the first duct channel path 128 and over the converter heat sink 132. In addition, the guide vane 286 reduces turbulence caused by vortex shedding that would otherwise occur at the base 288 of the interior partition wall 176. Reducing turbulence reduces backpressure and increases air flow. In addition, the use of the guide vane 286 allows for a single blower 74 with a common air source (e.g., the inlet air 87) to be used to supply cooling air to the first and second duct channel paths 128, 130.

While only certain features of the invention have been illustrated and described herein, many modifications and changes will occur to those skilled in the art. It is, therefore, to be understood that the appended claims are intended to cover all such modifications and changes as fall within the true spirit of the invention.

The invention claimed is:

1. A ducted electrical power conversion system, comprising:
a first structural duct assembly configured to sealingly receive a converter;
the converter supported on the first structural duct assembly, a converter heat sink of the converter extending into a converter cooling air channel of the first structural duct assembly;
a second structural duct assembly mated to the first structural duct assembly and configured to sealingly receive an inverter; and
the inverter supported on the second structural duct assembly, an inverter heat sink of the inverter extending into an inverter cooling air channel of the second structural duct assembly.

2. The system of claim 1, wherein each of the first and second structural duct assemblies includes a respective partition separating the converter and inverter cooling air channels into separate first and second air channels.

3. The system of claim 2, wherein the first air channel defined by the respective partition directs cooling air past the inverter, without cooling the inverter, into contact with the converter heat sink.

4. The system of claim 3, wherein the second air channel defined by the respective partition directs cooling air into contact with the inverter heat sink and past the converter, without cooling the converter.

5. The system of claim 2, comprising a guide vane adjacent to a base of one of the partitions for controlling flow of cooling air through the first and second air channels.

6. The system of claim 5, wherein the guide vane is disposed adjacent to an inlet air duct in which a blower directs air into the first and second structural duct assemblies.

7. The system of claim 1, wherein the first structural duct assembly comprises at least one wall section having a step or baffle configured to direct cooling air into contact with the converter heat sink.

8. The system of claim 1, wherein the second structural duct assembly comprises at least one wall section having a step or baffle configured to direct cooling air into contact with the inverter heat sink.

9. The system of claim 8, wherein the inverter comprises three or more separate switching modules for converting DC power to controlled frequency AC power, and wherein the second structural duct assembly comprises at least one wall section having a plurality of steps or baffles configured to direct cooling air towards a portion of the inverter heat sink generally corresponding to locations of the three or more separate switching modules.

10. The system of claim 1, wherein the first structural duct assembly is capable of supporting the converter when the first structural duct assembly is lifted for displacement without removal of the converter from the first structural duct assembly.

11. The system of claim 1, wherein the second structural duct assembly is capable of supporting the inverter when the second structural duct assembly is lifted for displacement without removal of the inverter from the second structural duct assembly.

12. The system of claim 1, wherein the first and second structural duct assemblies are capable of supporting the inverter and the converter when the first and second structural duct assemblies are lifted together for displacement without removal of the converter from the first structural duct assembly and without removal of the inverter from the second structural duct assembly.

13. A ducted electrical power conversion system, comprising:
a converter comprising a converter circuitry for converting AC power to DC power and a converter heat sink for cooling the converter circuitry;
a first structural duct assembly configured to sealingly receive the converter with the converter heat sink extending into a converter cooling duct channel of the first structural duct assembly, wherein the first structural duct assembly is capable of supporting the converter when the first structural duct assembly is displaced without removal of the converter from the first structural duct assembly;
an inverter comprising a inverter circuitry configured to convert DC power from the converter, or other DC feed, to controlled frequency AC power and an inverter heat sink for cooling the inverter circuitry; and
a second structural duct assembly mated to the first structural duct assembly and configured to sealingly receive the inverter with the inverter heat sink extending into an inverter cooling duct channel of the second structural duct assembly, wherein the second structural duct assembly is capable of supporting the inverter when the second structural duct assembly is displaced without removal of the inverter from the second structural duct assembly.

14. The system of claim 13, wherein the first and second structural duct assemblies are capable of supporting the inverter and the converter when the first and second structural duct assemblies are lifted together for displacement without removal of the converter from the first structural duct assembly and without removal of the inverter from the second structural duct assembly.

15. The system of claim 13, wherein each of the first and second structural duct assemblies includes a respective partition separating the converter and inverter cooling duct channels into separate first and second air channels.

16. The system of claim 15, wherein the first air channel defined by the respective partition directs cooling air past the inverter, without cooling the inverter, into contact with the converter heat sink.

17. The system of claim 16, wherein the second air channel defined by the respective partition directs cooling air into contact with the inverter heat sink and past the converter, without cooling the converter.

18. The system of claim 15, comprising a guide vane adjacent to a base of one of the partitions for controlling flow of cooling air through the first and second air channels.

19. The system of claim 18, wherein the guide vane is disposed adjacent to an inlet air duct in which a blower directs air into the first and second structural duct assemblies.

20. A ducted electrical power conversion system, comprising:
   a converter comprising converter circuitry for converting AC power to DC power and a converter heat sink for cooling the converter circuitry;
   a first structural duct assembly configured to sealingly receive the converter with the converter heat sink extending into a converter cooling air channel of the first structural duct assembly, wherein the first structural duct assembly is capable of supporting the converter when the first structural duct assembly is displaced without removal of the converter from the first structural duct assembly;
   an inverter comprising inverter circuitry configured to convert DC power from the converter, DC feed, or common bus, to controlled frequency AC power and an inverter heat sink for cooling the inverter circuitry;
   a second structural duct assembly mated to the first structural duct assembly and configured to sealingly receive the inverter with the inverter heat sink extending into an inverter cooling air channel of the second structural duct assembly, wherein the second structural duct assembly is capable of supporting the inverter when the second structural duct assembly is displaced without removal of the inverter from the second structural duct assembly;
   first and second partitions disposed in the first and second structural duct assemblies, respectively, for separating the converter and inverter cooling air channels into separate first and second air channels;
   first and second baffled walls in the first and second structural duct assemblies, respectively, for directing cooling air into contact with the converter heat sink and the inverter heat sink, respectively;
   an inlet air duct disposed adjacent to the second structural duct assembly for directing cooling air from a blower into the first and second air channels; and
   a guide vane adjacent to the inlet air duct for controlling flow of cooling air through the first and second air channels.

* * * * *